United States Patent
Bjorneklett et al.

(10) Patent No.: US 10,224,452 B2
(45) Date of Patent: Mar. 5, 2019

(54) PHOTO VOLTAIC GENERATOR PANEL, METHOD AND SYSTEM

(75) Inventors: Borge Bjorneklett, Sandvika (NO); Oystein Holm, Sandvika (NO); Erik Sauar, Sandvika (NO)

(73) Assignee: REC SOLAR PTE. LTD., Tuas (SG)

( * ) Notice: Subject to any disclaimer, the term of this patent is extended or adjusted under 35 U.S.C. 154(b) by 1479 days.

(21) Appl. No.: 13/697,500

(22) PCT Filed: Apr. 27, 2011

(86) PCT No.: PCT/EP2011/056678
§ 371 (c)(1),
(2), (4) Date: Apr. 22, 2013

(87) PCT Pub. No.: WO2011/141293
PCT Pub. Date: Nov. 17, 2011

(65) Prior Publication Data
US 2013/0206206 A1    Aug. 15, 2013

(30) Foreign Application Priority Data

May 13, 2010 (GB) .................................. 1008030.7
Apr. 1, 2011 (GB) .................................. 1105557.1

(51) Int. Cl.
*H02N 6/00* (2006.01)
*H01L 31/042* (2014.01)
*H01L 31/18* (2006.01)
*H01L 31/048* (2014.01)
(Continued)

(52) U.S. Cl.
CPC .............. *H01L 31/18* (2013.01); *F24S 25/33* (2018.05); *F24S 25/615* (2018.05);
(Continued)

(58) Field of Classification Search
CPC ... H01L 31/0422; H01L 31/18; H01L 31/048; H02S 20/00; H02S 20/23; F24J 2/5205;
(Continued)

(56) References Cited

U.S. PATENT DOCUMENTS

| | | | |
|---|---|---|---|
| 2003/0015636 A1* | 1/2003 | Liebendorfer | F24J 2/5205 248/237 |
| 2009/0114271 A1* | 5/2009 | Stancel | F24J 2/5205 136/251 |
| 2011/0108103 A1* | 5/2011 | Tuma | H01L 31/03926 136/256 |

FOREIGN PATENT DOCUMENTS

| | | | |
|---|---|---|---|
| CA | 1111535 A1 | 10/1981 | |
| DE | 4014200 A1 * | 11/1990 | .......... E06B 3/5427 |

(Continued)

OTHER PUBLICATIONS

English machine translation of JP 2005268260 A.*
English machine translation of DE 4014200 A1.*
English machine translations of JP-2005268260-A. (Year: 2018).*

*Primary Examiner* — Angelo Trivisonno
(74) *Attorney, Agent, or Firm* — Blank Rome LLP

(57) ABSTRACT

A method is provided of fabricating a photo voltaic generator panel (15) including a polymer back sheet (24) with at least one attachment feature (21) so as to provide means of attaching the panel to a structural support (25) upon subsequent installation. At least one polymer attachment feature (21) is applied to the outer side of the polymer back sheet of the panel during the manufacturing process for the panel whereby the attachment feature projects with respect to the back sheet. The application may be in conjunction with a lamination process, or subsequent to the lamination process, or as an integral part of the back sheet manufacturing process. The attachment feature is adapted to engage with a corresponding feature (26) or features to be found on a support structure (25) located at a site for the installation of the panel. The said at least one polymer attachment feature and said outer side of the polymer back sheet have a similar thermal expansion coefficient.

31 Claims, 27 Drawing Sheets

(51) Int. Cl.
*H02S 20/23* (2014.01)
*H02S 20/10* (2014.01)
*F24S 25/615* (2018.01)
*F24S 40/80* (2018.01)
*F24S 25/632* (2018.01)
*F24S 25/33* (2018.01)
*F24S 25/60* (2018.01)

(52) U.S. Cl.
CPC ............. *F24S 25/632* (2018.05); *F24S 40/80* (2018.05); *H01L 31/048* (2013.01); *H02S 20/10* (2014.12); *H02S 20/23* (2014.12); *F24S 2025/601* (2018.05); *F24S 2025/6007* (2018.05); *Y02B 10/12* (2013.01); *Y02E 10/47* (2013.01); *Y02E 10/50* (2013.01)

(58) Field of Classification Search
CPC ........ F24J 2/5249; F24J 2/4636; F24J 2/5254; F24J 2002/467; F24J 2002/4676; Y02B 10/12; Y02E 10/47; Y02E 10/50

USPC ................. 136/244, 246; 438/64; 52/745.05, 52/745.06, 29, 173.1, 64, 65, 66, 745.13
See application file for complete search history.

(56) References Cited

FOREIGN PATENT DOCUMENTS

| | | | |
|---|---|---|---|
| DE | 102005057468 A1 | 5/2007 | |
| JP | 2005 268260 A | 9/2005 | |
| JP | 2005268260 A * | 9/2005 | |
| JP | 2005268260 A * | 9/2005 | ............. F24J 2/5254 |
| WO | WO 2009059738 A2 * | 5/2009 | ............. H02S 20/00 |
| WO | 2009/029952 A2 | 7/2009 | |
| WO | 2009/102772 A2 | 8/2009 | |
| WO | 2009/059738 A2 | 9/2009 | |
| WO | 2009/158715 A2 | 12/2009 | |

* cited by examiner

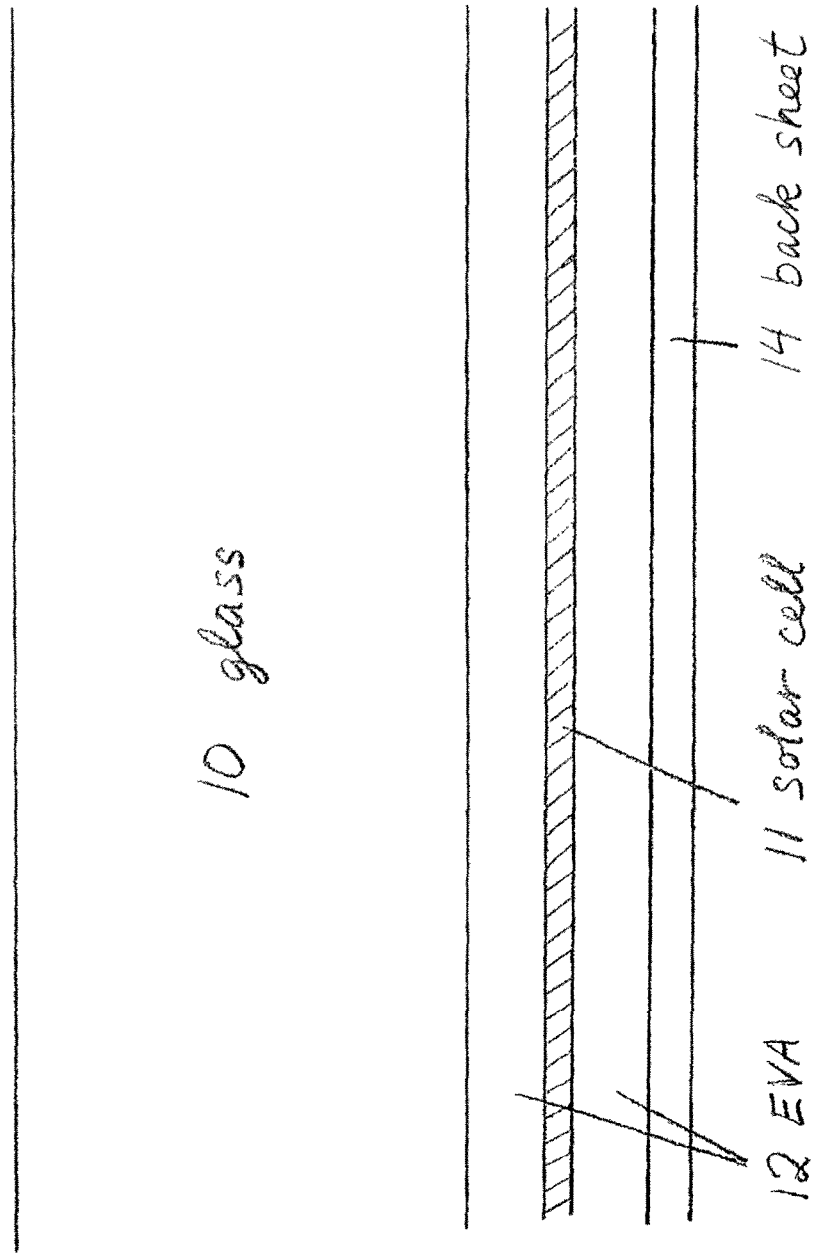

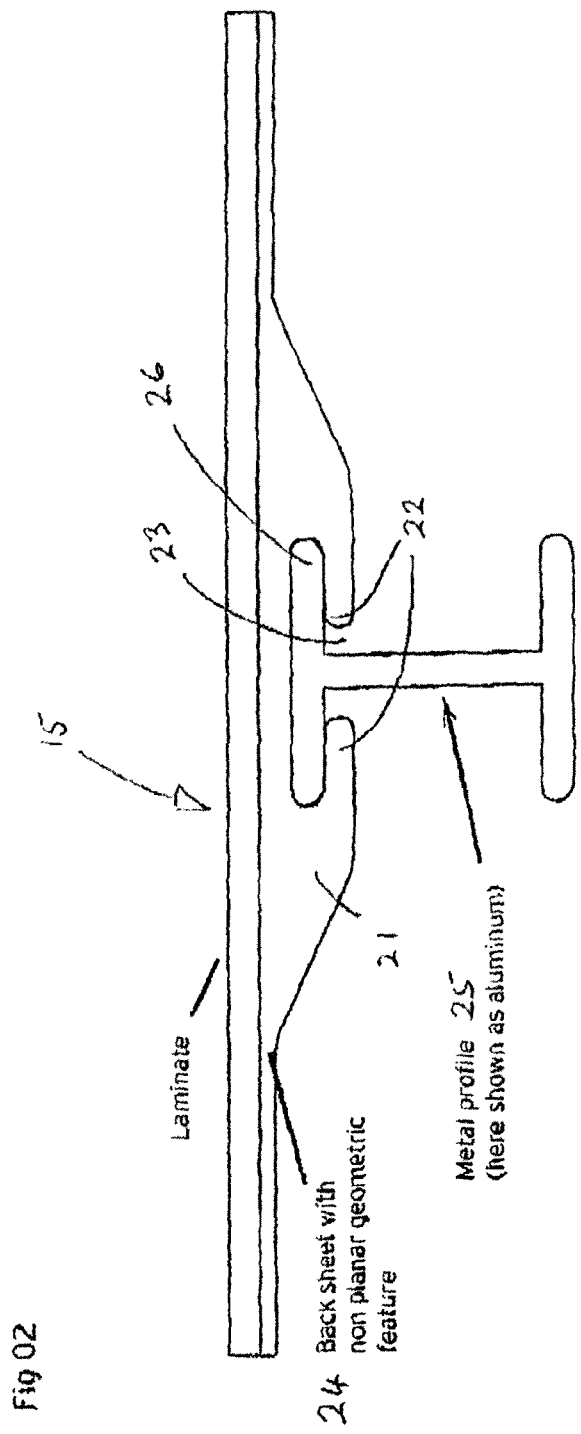

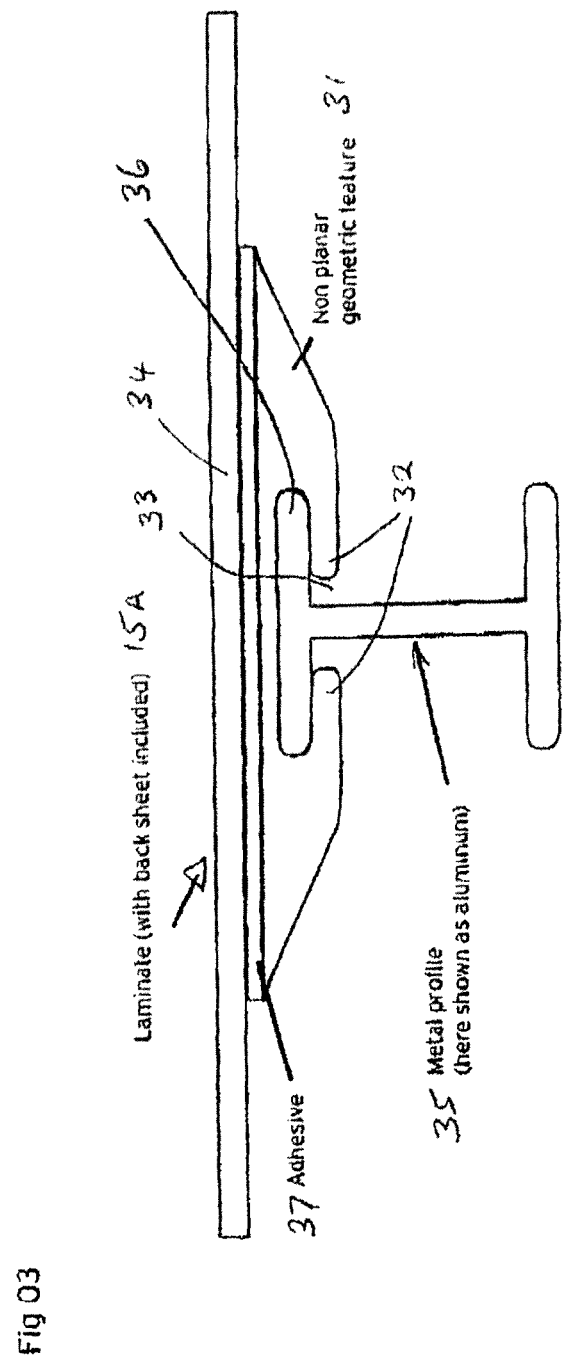

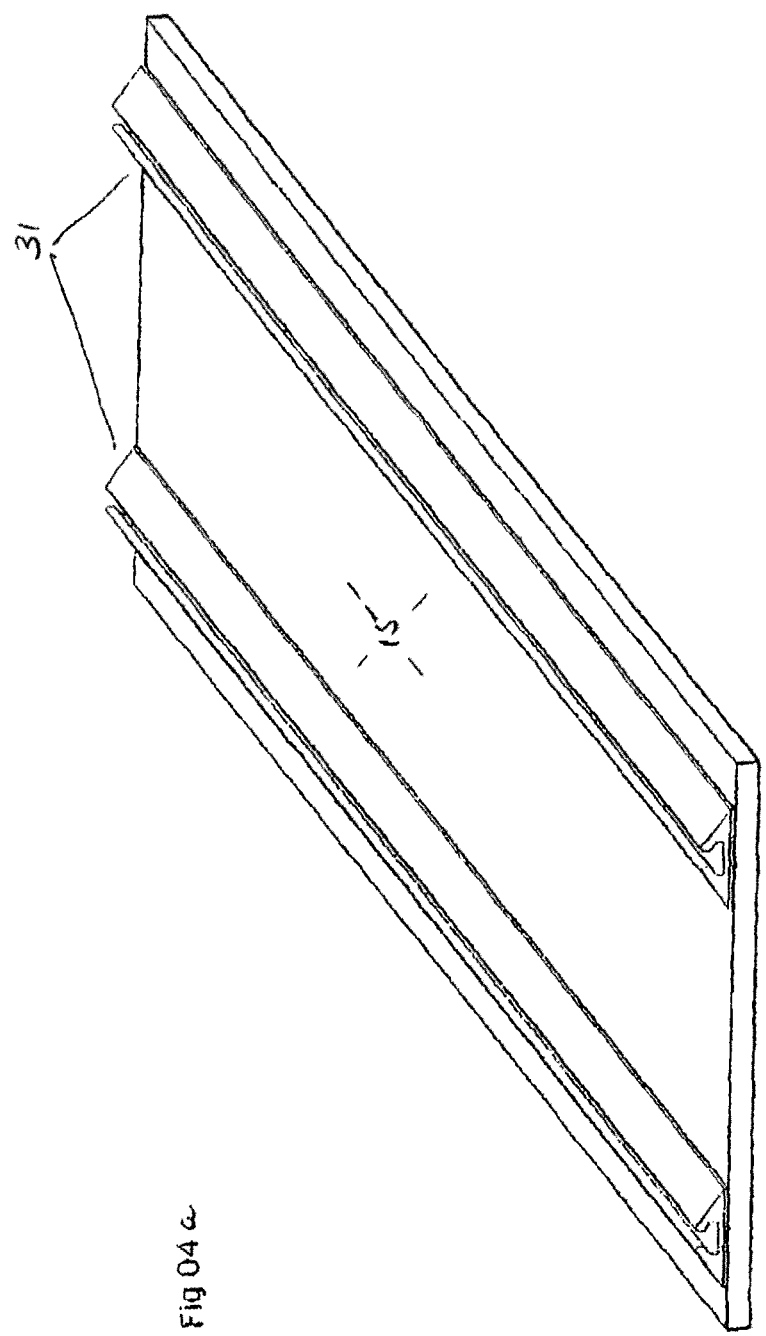

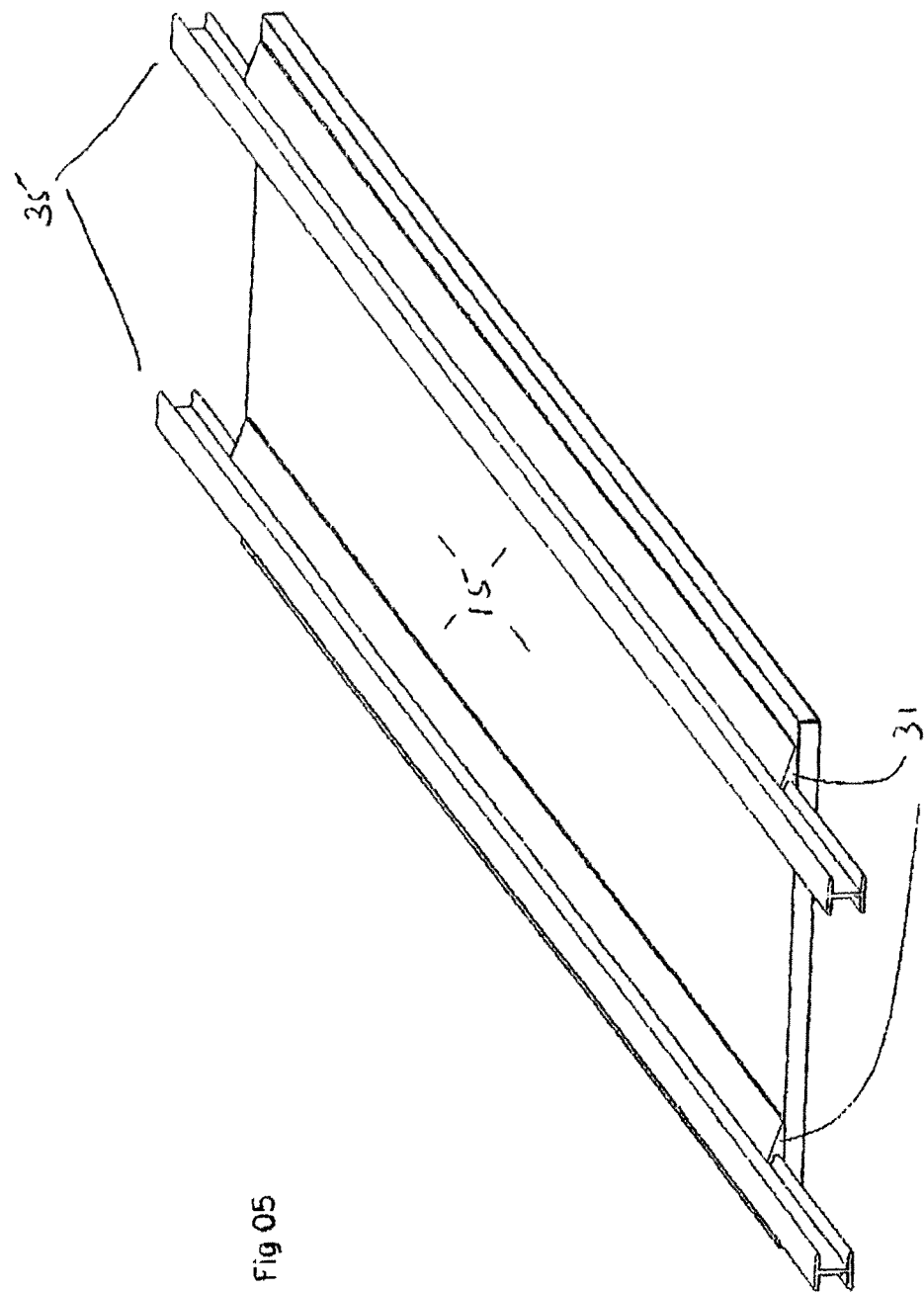

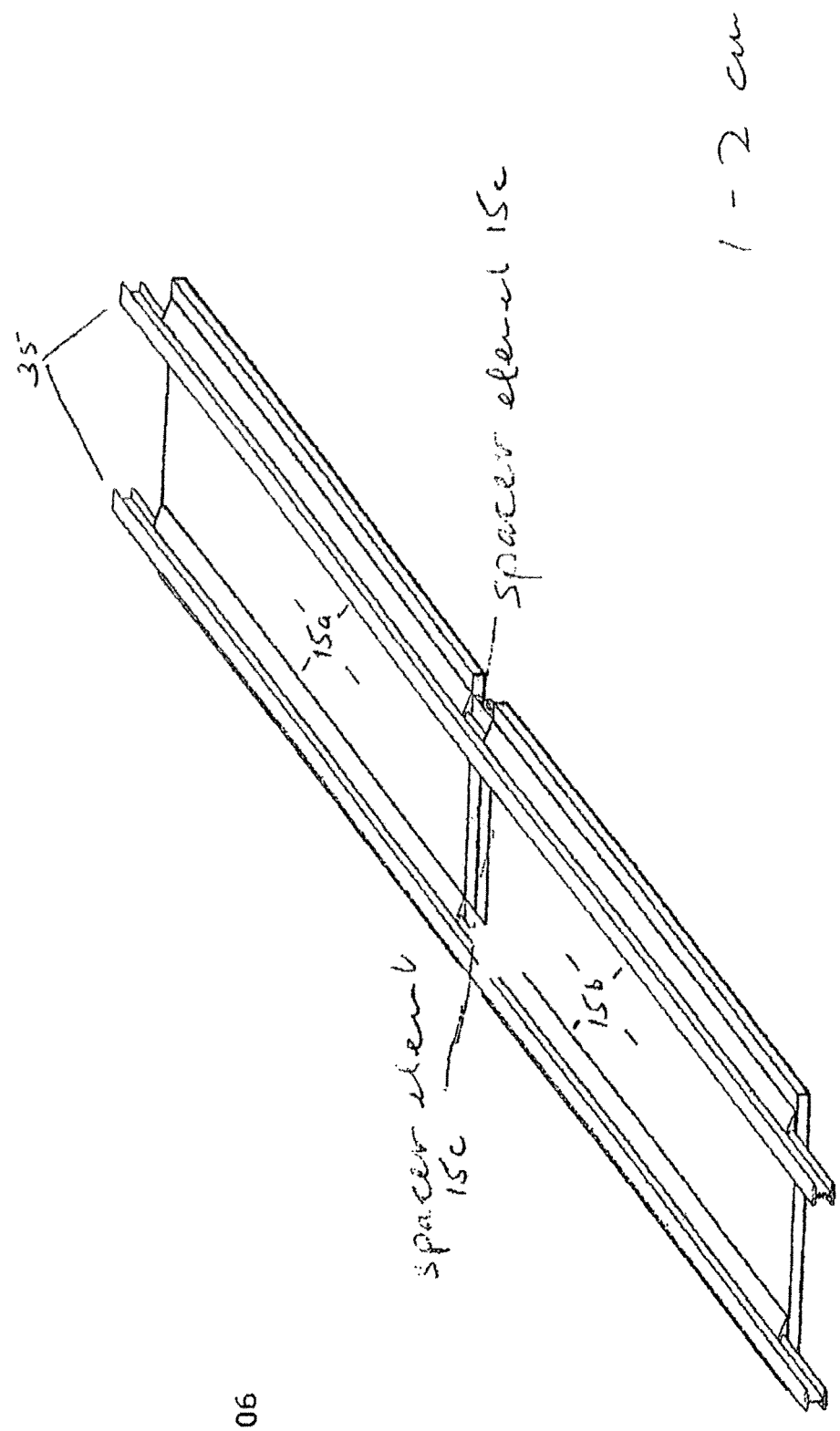

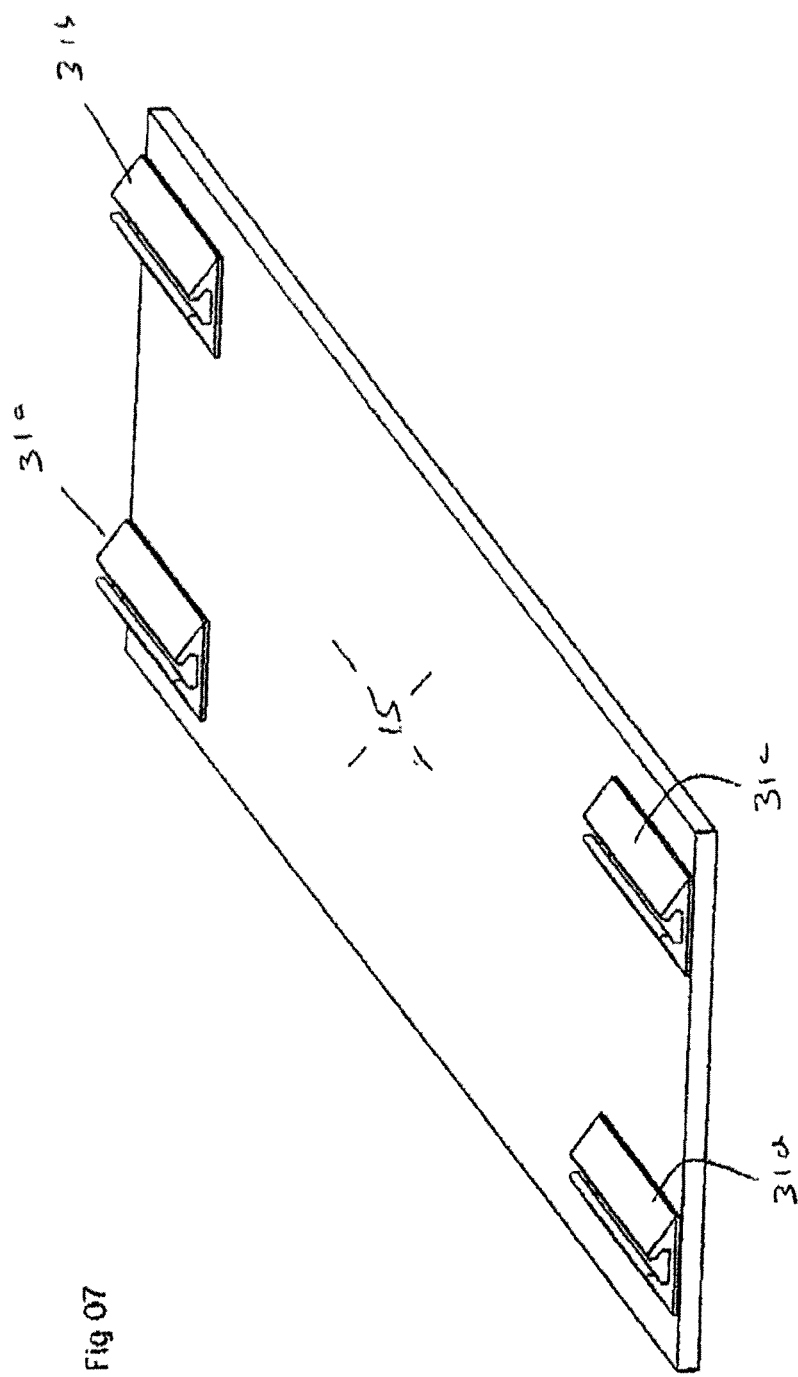

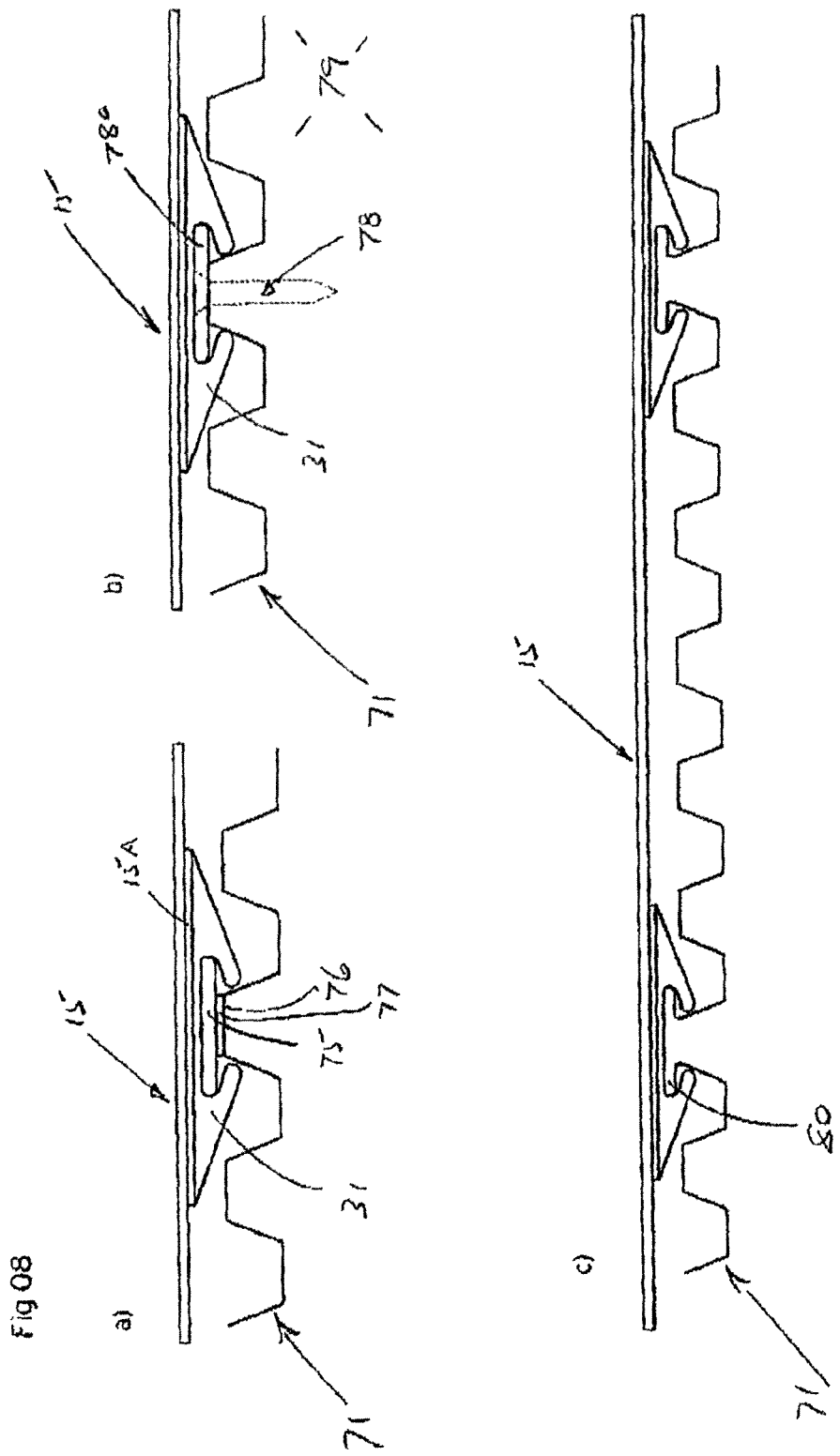

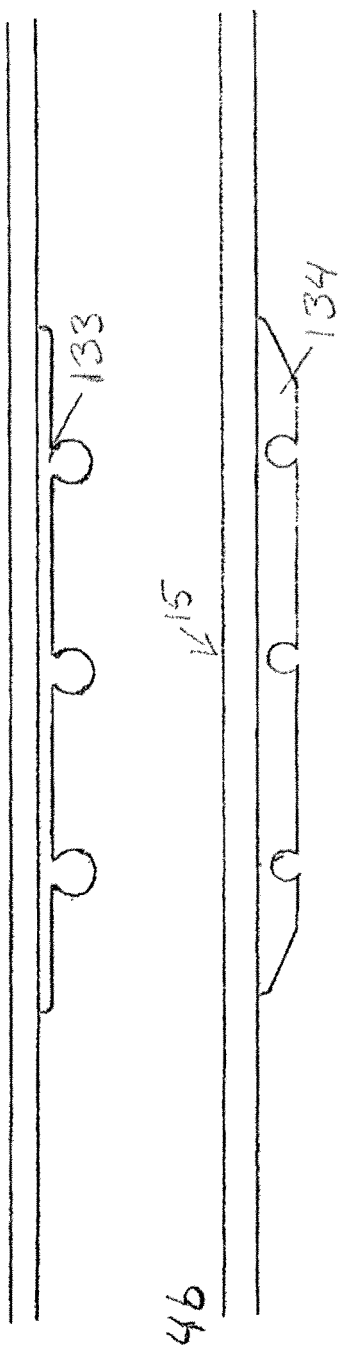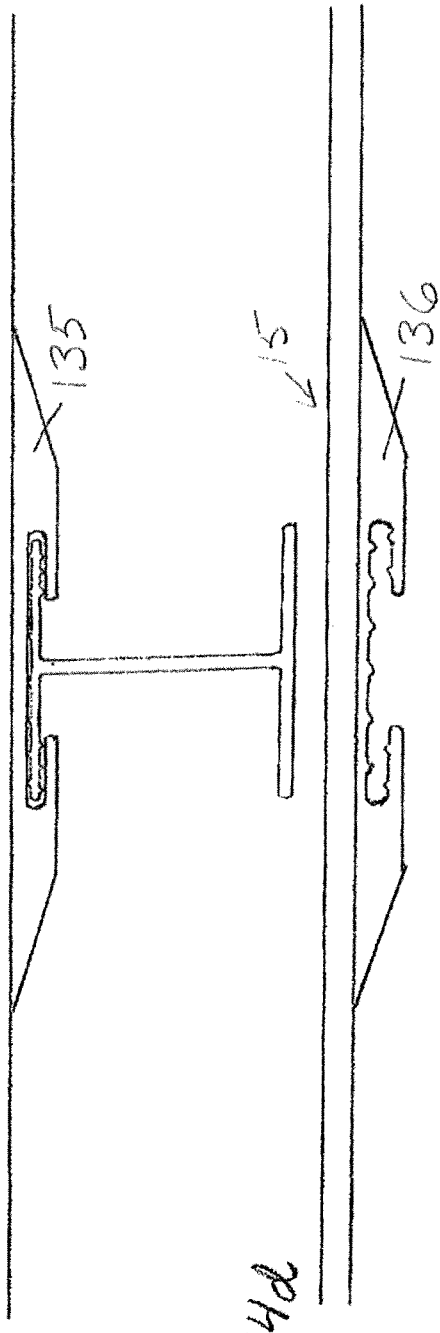
Fig 14a, Fig 14b, Fig 14c, Fig 14d

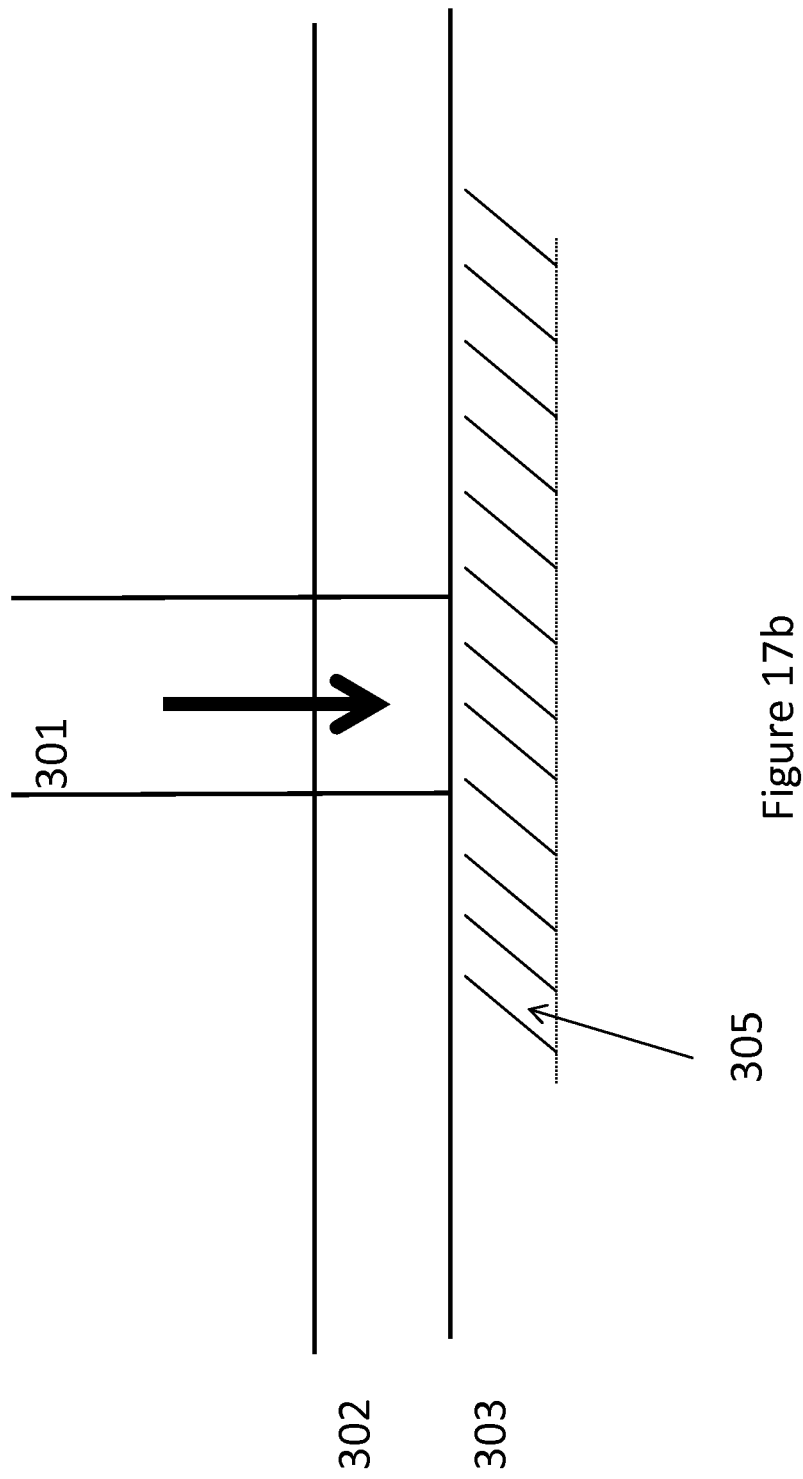

PHOTO VOLTAIC GENERATOR PANEL, METHOD AND SYSTEM

CROSS-REFERENCE TO RELATED APPLICATION

The present application is a National Phase of and claims the benefit of PCT/EP2011/056678, with an international filing date of Apr. 27, 3011, which in turn claims priority to GB 1008030.7 filed May 13, 2010 and GB 1105557.1 filed Apr. 1, 2011, the entire disclosures of which are incorporated by reference herein.

FIELD OF THE INVENTION

The invention relates to a photo voltaic (PV) panel facilitating effective installation and support for the PV panel or a series of such panels.

BACKGROUND OF THE INVENTION

In the production and fitting of solar panels to roofs of buildings, tracker structures or fixed ground mounting structures, transport and final installation costs are significant. By the nature of their characteristics, solar panels consist of thin laminates, the rigidity of which is critical to their performance and durability under various weather conditions in different geographical regions of the world.

Some PV solar panels known today are planar laminated products. They consist of a front glass "superstrate", a multiplicity of solar cells encapsulated by a polymer and a back sheet. These are bonded into one planar panel by a lamination process. Some laminates are supported by an aluminum frame. For installation of such a PV panel, this frame may be mounted on an underlying support structure by four mounting devices. The mounting devices may be screwed clamps. This requires assembly of a number of small parts at the installation site, which is a time-consuming method of fixation. When the panels are correctly mounted in accordance with the installation manual for solar panels, they are able to withstand mechanical loads which can be induced by snow and wind.

Some types of panels are frameless. These are typically attached by aluminium clamps lined with rubber. This configuration generally gives a lower load-bearing capacity, particularly if the glass is thin. Another configuration is glass-glass laminates with adequate stiffness, but with the disadvantage of a higher weight. The present invention relates to PV panels for grid connection. PV panels for grid connection normally require certification by independent authorities e.g. TUV Rheinland or Underwriters Laboratory (UL).

The solar cells are generally vulnerable to stress, which may lead to micro-cracks and accompanying power loss. It is therefore desirable to have an essentially stiff panel when installed. The planar stiffness of the panel may be achieved by the glass superstrate and the frame, sometimes with additional reinforcement rails across the back sheet. The moment of inertia increases with glass thickness and height of frame members, thereby providing increased rigidity. However, the penalty with thicker glass is increased weight, reduced heat transfer properties, and more difficult handling and installation work. If the height of the frame is increased, the penalty is greater packaging volume and associated transport costs.

Heretofore it has been known to have strengthening stiffener components added to a solar panel at the point of manufacture. For instance CA1,111,535A1, (Exxon-1981) presents a support structure on the rear-side of the solar cell panel which is formed of a lightweight high strength plastic material having integral rib stiffeners to provide longitudinal and lateral stiffness. These rib stiffeners can be formed by plastic molding and permanently joined directly onto the back of the solar panel during the manufacturing phase. Hence the system in CA1,111,535A1 is dependent solely on a plastic structure for supporting the panel under load. Plastic is a relatively soft material and therefore CA1,111,535A1 discloses a large structure which is relative thick, resulting in low packaging density.

DE4,014,200A1, (Telefunken-1990) describes a frameless solar panel with a glass covered front-side and mounting profiles on the rear-side with an elastic joining material. The mounting profiles are glued to the rear-side of the laminate at the initial manufacturing stage to form permanent stiffening, and can have different shapes such as "U", "L" or "T" profiles. With this solution the joining material will potentially suffer from fatigue due to thermally induced movement between parts with different thermal expansion coefficients.

DE102005,057,468A1, (Solarwatt-2007) describes a large frameless panel with high stability and stiffness obtained from a box or frame structure on the rear-side. The box or frame structure is permanently fixed to the panel at the point of manufacture. Again, with this solution the joining material can potentially suffer from fatigue due to thermal cycling since the adhesive joins materials of different thermal expansion coefficients.

WO2009/158,715A2, (Sunpower-2009) describes a solar panel with a plastic frame which has permanent strengthening shapes formed on its reverse face at the point of manufacture. This specification also discloses interconnecting capabilities which enable the panel to be laid out directly on a flat (e.g. roof) surface. More than one such panel can be interconnected without the need of additional mounting structures. When the permanent stiffening shapes are formed with or connected to the panel at the time of manufacture, the product suffers from the disadvantage of being of a substantial volume to transport to site.

In all four examples of prior art described above, the specifications deal with permanent stiffening which is integrally formed or added at the point of manufacture, and so leads to an increased total volume which it is necessary to transport with the panel to the point of use (as compared with the actual volume of the solar panel).

WO2009/102,772A2, (Applied Materials-2009) describes a large frameless panel which has stiffening profiles glued on to the rear-side at the time of installation for obtaining stiffness when installed. The gluing process is described to be performed "on site" which is critical with respect to quality. Hence the method of cleaning and drying the panel prior to the gluing process and the related tooling are significant parts of the disclosure. The use of adhesive bonding requires closely controlled surface preparation, aging time and a subsequent curing process at elevated temperature and humidity levels. Such bonding is an expensive operation to perform on site. It is difficult to achieve high quality adhesive bonding on site in variable weather conditions.

There is therefore a need to provide improved PV generator panels, the panels having the required stiffness when installed to ensure long term operational performance in challenging environments, together with compact geometries to reduce material use and aid transportation, thereby providing the potential for cost reduction and significantly reduced environmental impact.

SUMMARY OF THE INVENTION

The present invention relates to PV panels for grid connected power production.

In accordance with a first aspect of the invention there is provided a method of fabricating a photo voltaic generator panel including a glass superstrate and a polymer back sheet with at least one attachment feature, so as to provide means of attaching the panel to a structural support upon subsequent installation, the method comprising: applying at least one polymer attachment feature to the outer side of the polymer back sheet of the panel during the manufacturing process for that panel such that the attachment feature projects with respect to the back sheet, the application being in conjunction with a lamination process, or subsequent to the lamination process, or as an integral part of the back sheet manufacturing process; the configuration of the attachment feature being such as to engage with a corresponding at least one feature to be found on site for the installation of the panel, wherein the said at least one polymer attachment feature and said outer side of the polymer back sheet have a similar thermal expansion coefficient.

The present invention provides significant advantages over the prior art by the use of a method in which a polymeric panel back sheet and one or more polymeric attachment features are applied at the time of manufacture of the panel.

A particularly important feature of the present invention is that the at least one polymer attachment feature and the outer side of the polymer back sheet have a similar thermal expansion coefficient. Preferably the thermal expansion coefficients are similar in the sense that they are identical, or substantially so. Advantageously, this similarity reduces the shear stresses experienced by the joint between the polymer back sheet and the attachment feature. In the field of PVs long warranties, up to 25 years, are common and so it is critical that the joint is subject to as few stresses as possible. It will be appreciated that other parts of the polymer back sheet, in addition to the outer side, such as substantially all of the back sheet, may be provided with the said similar thermal expansion coefficient.

In accordance with a second aspect of the invention there is provided a method of installing a photo voltaic panel at an installation location, comprising:—
providing a photo voltaic panel fabricated by a method according to the first aspect of the invention; providing a support structure at the installation location, the support structure comprising at least one feature for engagement with the at least one attachment feature of the panel; and engaging the said at least one feature of the support structure with the said at least one attachment feature of the panel such that the photo voltaic panel is mounted to the support structure.

The present invention results from the realization that there are substantial advantages in the bringing together of the PV panel and its structural support and thereby obtaining the specified stiffness of the panel at the location where the installation of the PV panel is to take place rather than at the point of manufacture of the PV panel. The PV panel can be manufactured with a compact or low profile geometry enabling more efficient transportation and production costs. Whilst a means of mounting the PV panel to its support is needed to effect installation, the provision of at least one attachment feature (non planar geometric feature) to the outer side of the back sheet during the manufacturing process of the panel allows this to be achieved reliably and causes relatively small reductions in compactness since low-profile non-geometric features can be utilized. A further advantage is the mechanical engagement between the features on the panel and those providing the support. This allows for the accommodation of strains caused by thermally induced deformations, avoiding damage to the panel, and in particular the delicate photovoltaic cells.

The present invention is therefore fundamentally different from known systems such as that described in CA1,111,535A1 in that, preferably, only relatively low-profile polymer parts (rather than upstanding rib stiffeners of a bulky support structure) are joined to the rear-side of the panel prior to installation. When leaving the place of manufacture, panels according to the present invention can be packed very compactly for transportation, without compromising the mechanical strength of the panels when installed.

The present invention is therefore also fundamentally different from known systems such as DE4,014,200A1 in that, with the present invention, the panel is joined to the stiffening structure at the installation point. The problem of fatigue arising from thermal cycling is greatly reduced by for example joining a polymer part to the glass-laminate and further mechanically attaching the panel to stiffening structural parts (possibly with a different thermal expansion coefficient) at the point of installation. This allows some relative movement between the parts to avoid stresses due to different thermal expansions.

The present invention avoids the need to use a box or frame structure such as that known in the art and as discussed earlier, but rather relies on mechanical joining of the panel to stiffening structures at the installation point. In this case, the invention reduces the volume for transportation by joining a polymer part to the glass laminate at the point of manufacture (such as by using an adhesive or welding), and further mechanically attaching the panel to a stiffening structural part at the point of installation. This allows some relative movement between the parts to avoid stresses due to different thermal expansions.

In a preferred embodiment, the step of applying the attachment feature to the outer side of the polymer back sheet is performed using a laser, wherein at least part of the attachment feature or back sheet is transparent to the said laser, wherein a laser-absorbing material is illuminated with the laser through the said transparent part so as to produce a laser weld between the attachment feature and the back sheet. The transparency may therefore be provided in the back sheet or attachment feature (this including each of them). In practice it may be most advantageous to make only the attachment feature transparent to the laser. The laser-absorbing material is typically provided as a layer in or on the respective back sheet or attachment feature.

In order to provide efficient manufacture, the laser weld is preferably applied as a linear process, the laser traveling along an elongate length of the attachment feature. Some attachment feature geometries, such as strips, are particularly advantageous for use with this preferred process. In order to improve the process efficiency, the laser may be simultaneously directed towards two spatially separated transparent parts of the attachment feature so as to form two laser welds simultaneously. This advantageously provides improved bonding strength between the back sheet and attachment feature. Two elongate parallel weld zones may be provided by the use of such a process.

The attachment between the features of the panel and support structure is mechanical. Adhesive bonding between the panel and stiffening support is therefore not required. The present invention is therefore not dependent on a critical gluing process on site, but relies on mechanical joining (engagement) of the panels to the stiffening structures at the installation point. This is a less quality sensitive method for providing stiffness to the panel, as no critical adhesion processes are required at or near the installation point. It is also more efficient with respect to installation time. Fast and easy "slide-in" or "snap-on" mounting is preferred since it further drives down the associated costs.

Further, in one embodiment the "slide-in" mounting has a symmetrical design so that the panel can be mounted on the support structure in both ways. This is an important aspect since the back of the PV panel normally has a junction box located on one of the sides for interconnection to neighbouring panels.

Mechanical engagement allows the features to be arranged, if desired, such that the panels may be detachable and therefore the panels may be repeatedly attached and detached as required for maintenance and replacement. A number of different attachment configurations are contemplated for the features (detachable or non-detachable), these including different attachment arrangements such as "slide-in" mechanisms and "snap-on" mechanisms. In general slide-in mechanisms allow the panels to be mounted by a sliding motion substantially parallel to their generally planar surface. Snap-on mechanisms may be provided for slide-in mechanisms but may also provide additional advantage in allowing the attachment motion to be substantially normal to the planar surface of the panel. This might also include cooperation with a hinging feature. A combination of these mechanisms is also contemplated. The provision of slide-in features is also advantageous in that it provides a secure and simple mechanism for transporting the panels (using the support structure) from a delivery location to the exact point of installation within a large support structure. This may be many meters from the delivery location.

A significant advantage of the present invention is that it allows the panels to be "frameless" since the support is provided on site at the installation location. In this document a frameless panel means a laminate without a conventional aluminium frame. The laminate can, however, be fitted with edge protection with essentially the same thickness as the laminate but does not provide the structural support of a frame. In order to maximize the use of insolation area, the attachment features may be arranged so that they do not extend beyond the edge of the back sheet. Some relatively minor extending of the attachment features beyond the back sheet edge(s) may be desired to establish a certain small gap between individual panels to promote convective cooling and also to assist in installation. Typically the attachment feature(s) will not extend beyond the edge of the back sheet by more than 10 millimeters.

The avoidance of the need for a frame provides significant contrast with the prior art outlined above. Thus, the present invention does not require the use of a frame, but instead has rear-side mounting members enabling easy, fast and robust mechanical joining of the panels to stiffening structures at the installation point. This is a much more effective method of obtaining a quality product by enhancing the stiffness of the structure at the point of intended installation.

The attachment features of the present invention can result in a shape which enables the panel to be laid out directly on a roof surface that is prepared for attachment of the PV panels. Thus the features of the support structure can be attached directly to the roof. Alternatively, support rails or other mountings are fixed to the roof prior to installation of the panels.

The invention includes photo voltaic generator panels produced according to the method of the first aspect of the invention and therefore, in accordance with a third aspect of the invention there is provided a photo voltaic generator panel including a glass superstrate, photovoltaic cells and a polymer back sheet, in which there is on the outside of the back sheet at least one polymer attachment feature manufactured with the panel, such feature projecting with respect to the back sheet and being configured to engage with at least one corresponding feature incorporated in a support structure at site when the panel has been transported to that site, and wherein the said at least one polymer attachment feature and said outer side of the polymer back sheet have a similar thermal expansion coefficient.

It is preferred that the at least one attachment feature is contained fully within a geometrical envelope defined by the edges of the back sheet. This provides for the maximum use of the insolation area in any array of panels.

The at least one feature of the support structure may be a mounting counterpart of the feature of the panel back sheet.

In order to engage a panel with features of the support structure, for example in the form of mounting members, the attachment features are preferably shaped to allow fast and easy attachment, such as by slide-in or snap-on (snap fit) connections as discussed above.

The attachment features can be of different forms including grooves, slots, protrusions or lips. The attachment features project from the back sheet in the sense that, typically, the back sheet has a substantially planar rear surface and the attachment features projects out of (and therefore away from) this plane. The attachment features can be an integral part of the back sheet or can be bonded to the back sheet as part of the PV panel manufacturing process. However, the preferred technique is to use laser welding, with a transmissive arrangement, in order to provide a strong joint between separate back sheet and attachment feature components.

Typically such features project away from the general plane of the back sheet and may be thought of as non-planar geometric features. These are typically raised elements having a shaped recess or shaped projection to accommodate part of the corresponding feature of the support structure. The attachment features may be elongate in a particular direction to provide support extending along a panel dimension and may therefore take the form of a strip. In a preferred embodiment the attachment features takes the form of two parallel elongate strips. In this case the recess or projection may have a constant section extending along the length of the feature in the elongate direction. The features may also be localized features and in this case be thought of as pads.

The shape of the recess or projection may be adapted to receive the corresponding feature of the support structure from a direction substantially normal to the plane of the panel. The recess or projection may alternatively be adapted to receive the corresponding feature of the support structure from a direction substantially normal to the plane of the panel. The cross sections of the recesses or projections may include "T", "C", or "U" sections. Some may be provided with intentionally resilient parts to allow ratchet or snap-fit mechanisms by temporary elastic deflection of part of the feature. Whilst each attachment feature may be of a similar form for a particular panel, it is also envisaged that two or more features may cooperate together to provide an attachment means—for example the use of a protrusion feature to provide a hinge at a first attachment location and a snap-fit feature to provide the secure mounting at a second attachment location. It will be appreciated that in many cases the complementary geometries of the attachment features and those of the support structure with which they engage can be interchanged.

With a suitable design of the attachment feature, in combination with an underlying support structure optimized according to the requirements of the actual installation site, the balance between material consumption and mechanical performance is greatly improved. For example, an installation in a desert region (without any snow load requirement and little wind) can be much cheaper than an installation in a region with high snow and wind loads. Notably however, daily maximum and minimum temperatures experienced can be extreme in desert environments and in such situations, despite reduced mechanical load requirements, the use of matched thermal expansion coefficients in the back sheet and attachment feature are particularly advantageous. PV installations with known PV panels cannot be optimized to the same degree, because this kind of panel is dimensioned to withstand high snow and wind loads regardless of installation site. This optimizing is not appropriate or necessary for all regions.

The attachment feature is preferably a polymer strip which can be either extruded or molded. The polymer strip can be bonded by adhesive methods to the outer side of the back sheet. Such adhesive methods can typically be gluing, taping, or welding. The mechanical connection between the strip and the support structure (such as support rails) is sufficient to carry the reverse loads generated by wind suction (underpressure) forces.

Where the attachment features are not formed simultaneously with the back sheet but are rather mounted afterwards, an important aspect during manufacturing is the carefully controlled adhesion or welding of the attachment feature to the back sheet. The material and surface finish of the attachment feature is selected from materials with high bonding compatibility towards the back sheet polymer, thus avoiding typical durability issues pertaining to adhesively bonded parts. In a preferred embodiment, the said at least one polymer attachment feature and said outer side of the polymer back sheet have a substantially identical thermal expansion coefficient.

Preferably, the polymer attachment feature is welded onto the back sheet. The welding can be performed with well established techniques such as laser welding, hot plate or hot tool welding, friction, spin or vibration welding, induction welding (by using thin metallic inlays between parts), ultrasonic welding, hot gas welding, high frequency welding or other joining methods.

In a preferred embodiment where the attachment feature is transmission laser welded to the back sheet, the attachment feature has at least one part transparent to IR laser radiation. The use of a transmission arrangement allows for an extensive weld zone since the incident angle of the laser is not as restricted as would be the case for a non-transmissive orientation. Furthermore, the transmissive arrangement allows greater choice of beam geometries at the point of incidence in the weld zone. Preferably the at least one transparent part of the attachment feature is a flange for attachment to the back sheet. This advantageously provides a strong and wide bonding joint. In this embodiment the panel further comprises a laser-absorbing layer on one or each of the back sheet and feature. The back sheet alone may contain such an absorbing layer or the attachment feature alone may contain such an absorbing layer or both may contain such a layer. It will be appreciated that such a layer is typically a surface layer. The absorbing layer may be colored black by the use of an ink jet printer or other application techniques. The pigment for the absorbing may typically consist of carbon black. The laser light frequency for use with the absorbing material may typically be an infra-red frequency.

In one embodiment the attachment feature is formed as an elongate strip and the at least one transparent part comprises two opposing elongate lengths of said elongate strip.

Moreover the materials should be compatible in terms of thermal characteristics (such as thermal expansion coefficient), reducing tensile and compressive forces due to differential thermal expansion between parts that might otherwise lead to bending of the laminate or degradation of the joint by thermally induced fatigue.

For example, when a PV panel according to the invention is installed, differential expansion and contraction between the polymeric laminate and metallic support rails in the support structure can be accommodated by free linear sliding in the panel plane, minimizing tension and avoiding thermal induced fatigue.

The attachment feature will typically have low height relative (projecting out of the plane) to the otherwise planar area of the back sheet. This enables high density packaging of laminates for transportation, as compared to previously known PV panels with aluminum frames. This decreases the space needed in the production and storage areas (as well as during transportation) which reduces costs.

In accordance with a fourth aspect of the invention there is provided a photo voltaic generator panel installation system comprising a photo voltaic generator panel according to the third aspect of the invention; and a support structure for a photo voltaic generator panel, the panel having a glass superstrate, photovoltaic cells and a polymer back sheet in which there is on the outside of the back sheet at least one polymer attachment feature manufactured with the panel and which projects with respect to the back sheet, wherein the support structure comprises at least one feature for engagement with the at least one attachment feature. The support structure may form an integral part or entirely comprise the structure to which the panel is to be attached. It may also comprise a structure which is mounted to a building or other structure. One example of a typical support structure is a rail having features for engagement with those of the panel. A rail provides inherent alignment between plural features of the support structure and potentially the ability to modify the position of the features during installation to ensure easy attachment of the panel.

An advantage of a PV panel according to the present invention is rapid and easy mounting in any type of PV installation. Provided that an appropriate support structure is used, for example one having matching mounting rails, the product can be installed on to many different structures including roofs, tracker structures or fixed ground mounting structures. The support structure may therefore comprise a ground mounted metal structure, a concrete structure, a flat or tilted roof or a façade of a building, or a solar tracking structure, or other means for supporting photo voltaic generators. The feature of the support structure for engagement with the panel may be an integral part of a roofing element such as corrugated metal plates, ceramic roofing tiles, corrugated plastic plates, corrugated asphalt plates and asphalt shingles. The support structure may also comprise at least a part of the roofing material such as flat or corrugated plates, ceramic tiles, shingles and so on.

For those skilled in the art it will be obvious that large savings can be made as a result of the use of the support structure and panels of the present invention.

The prior art shows examples of PV panels which are bonded directly onto roofing materials or support structures typically by gluing methods, hence such panels cannot be removed without risking severe or permanent damage to the panel. A PV panel according to the present invention can preferably be removed without substantial risk of damage, which is an important feature for example for repair or replacement. This is made possible by the mechanical engagement between the features. Further, bonding directly onto roofing materials can introduce stresses in the bonds due to different thermal expansion coefficients. The present invention avoids this issue by not bonding the attachment features directly to the support structure.

The present system which combines the photo voltaic generator panel with the support structure results in numerous advantages. One such advantage is that the system has high flexural rigidity when installed, such that preferably the support structure is adapted to provide the majority of the flexural rigidity of the system in comparison with the flexural rigidity of the photo voltaic generator panel.

Such a system may comprise an additional anti theft protection, or features preventing unintentional sliding of the panel relative to the support structure, deformation of the mounting rail or the like, by means such as split pins, screws, pins, padlocks, glue and so on. Such a system may also be provided with spacer elements attached to the panels or support structure to promote uniform spacing of the panels on the support structure which aids in the cooling of the panels during use.

Another important advantage of the panels according to the present invention is reduction of the weight due to reduced glass thickness. A conventional PV panel typically weighs in the range 18-24 kg with glass thicknesses in the range 3.2-4.2 mm. A PV panel according to the present invention can use much thinner glass, typically 0.5-2.9 mm since the mechanical stiffness of the installed panel is provided by the underlying mounting structure. Thinner glass has a range of advantages for PV panels. Thinner glass will increase transparency which will increase the power production of the PV panel. Thinner glass reduces the weight and material usage of PV panels which reduces the direct cost of materials, and also reduces indirect costs of handling and transportation due to the lighter weight. Thinner glass results in reduced heat capacity of the glass which reduces the time for the lamination process of the PV panel. Thinner glass improves the heat dissipation from the PV panel which reduces the Normal Operating Cell Temperature (NOCT) and so increases power and hence the energy production.

For a typical PV panel, with an area of approximately 1.6 $m^2$, the weight of a conventional structural aluminum frame is 2.5-4 kg. A PV panel according to the present invention does not require an aluminum frame. A PV panel according to the present invention is typically frameless. In this document, frameless means having no frame or only a cosmetic or protective thin frame of material around the circumference. This reduction of glass thickness and removal of the aluminum frame results in a PV panel weight in the range of typically 8-16 kg. The material usage and associated energy consumption for production, environmental footprint and cost associated with PV systems is substantially reduced. The reduction of the weight of the PV panel results in easier handling, which in turn contributes to faster installation. This reduces installation cost and energy required for transportation of the product.

A PV panel according to the present invention provides a panel thickness which may be significantly reduced compared to a PV panel with an aluminum frame. A PV panel with aluminum frame has a panel thickness in the range 35-45 mm. A PV panel according to the present invention can have a panel thickness in the range 5-20 mm. This allows substantially more PV panels per volume, which has a range of advantages such as reduced space within the manufacturing and storage areas, reduced storage cost, reduced transportation volume and cost, and reduced energy consumption for transportation.

PV panels according to the present invention can therefore be stacked directly upon each other or beside each other since the attachment features may act as spacers between the panels. Known framed panels are stacked horizontally by adding plastic spacers between the panels. This makes the combined packaging space of panels and spacers even less dense. Vertically packed PV panels are ergonomically optimal to access, and the one or more attachment features can function as a 'handle' simplifying manual handling since such a PV panel can be carried by using only one arm by manufacturing, installation and transportation personnel. This reduces the work load for the installation workforce and reduces installation time and cost.

Without the aluminum frame, an array of PV panels according to the present invention can produce more power per PV array area than with known PV panels set in frames. On known PV panels the aluminum frame occupies a significant proportion of the array area which is subjected to solar radiation. In addition, the clamping methods used for fixation of such aluminum framed PV panels as well as frameless modules are dependent on bolts, washers and nuts which occupy space between the panels and result in gaps between each panel of typically 20-40 mm. An array of PV panels according to the present invention without aluminum frames and without clamping fixation methods can be mounted much closer to each other with gaps in the range 2-15 mm, hence a significantly larger portion of the irradiated area will be used for power production.

With some known mountings, the support rails are placed under frames closing the gaps between the panels which prevent air-circulation between adjacent panels. According to the present invention when support rails are used as a support structure these may be arranged to not close the gaps between adjacent panels. Hence free air-circulation results in significantly better convection cooling of the panels. This reduces the normal operating cell temperature WCT) which improves the power production. Alternatively the panels may be arranged to abut and at least be arranged substantially without gaps between them so as to maximize the use of the available area for receiving radiation.

A further problem associated with the aluminum frames of known PV panels is the fact that snow, ice or dirt can be obstructed and pile up at the lower edge of the panel where the aluminum frame covers the glass of the panel. If snow or dirt is piled up at the lower edge some solar cells are shaded, which reduces the total power production of the panel. If water penetrates between the frame and the panel edge, this may cause severe degradation of the panel if such water freezes. The combination of dirt and water may result in organic growth of fungus covering the lower part of the panel which may reduce the power production, and cause hot cells and degradation of the panel. Without an aluminum frame, an array of PV panels such as those according to the present invention may have a smooth planar glass surface without any obstructive frame at the lower edge. Hence the problems associated with snow, ice or dirt piling up at the lower frame edge are eliminated which ensures increased power production, reducing the need for cleaning and inspections, thus saving operation and maintenance cost, and extending the lifetime of the PV panel.

BRIEF DESCRIPTION OF THE DRAWINGS

Specific embodiments of the invention (in which the vertical scales are exaggerated) will now be described by way of example with reference to and as shown in the accompanying drawings, in which:

FIG. 1 is a diagrammatic side view of a photovoltaic panel showing its main components, FIG. 2—showing a first embodiment—is a cross section of a laminate engaged with part of a support structure, FIG. 3—showing a second embodiment—is a similar cross section, FIGS. 4a and 4b are rear views of two photovoltaic panels on their own, FIG. 5 is a rear view of another photovoltaic panel engaging a support structure, FIG. 6 is a rear view of two panels joined to common support structures, FIG. 7 is a rear view of another photovoltaic panel on its own, FIGS. 8a-c shows cross sections of three alternative methods for attaching a PV panel with at least one attachment feature to corrugated roofing material.

FIGS. 14a-d show cross sections of other examples of the attachment feature (polymer strips), FIGS. 17a and 17b show schematic diagrams of the laser welding of an attachment feature to the back sheet.

DETAILED DESCRIPTION OF SPECIFIC EMBODIMENTS

Figure 4B:
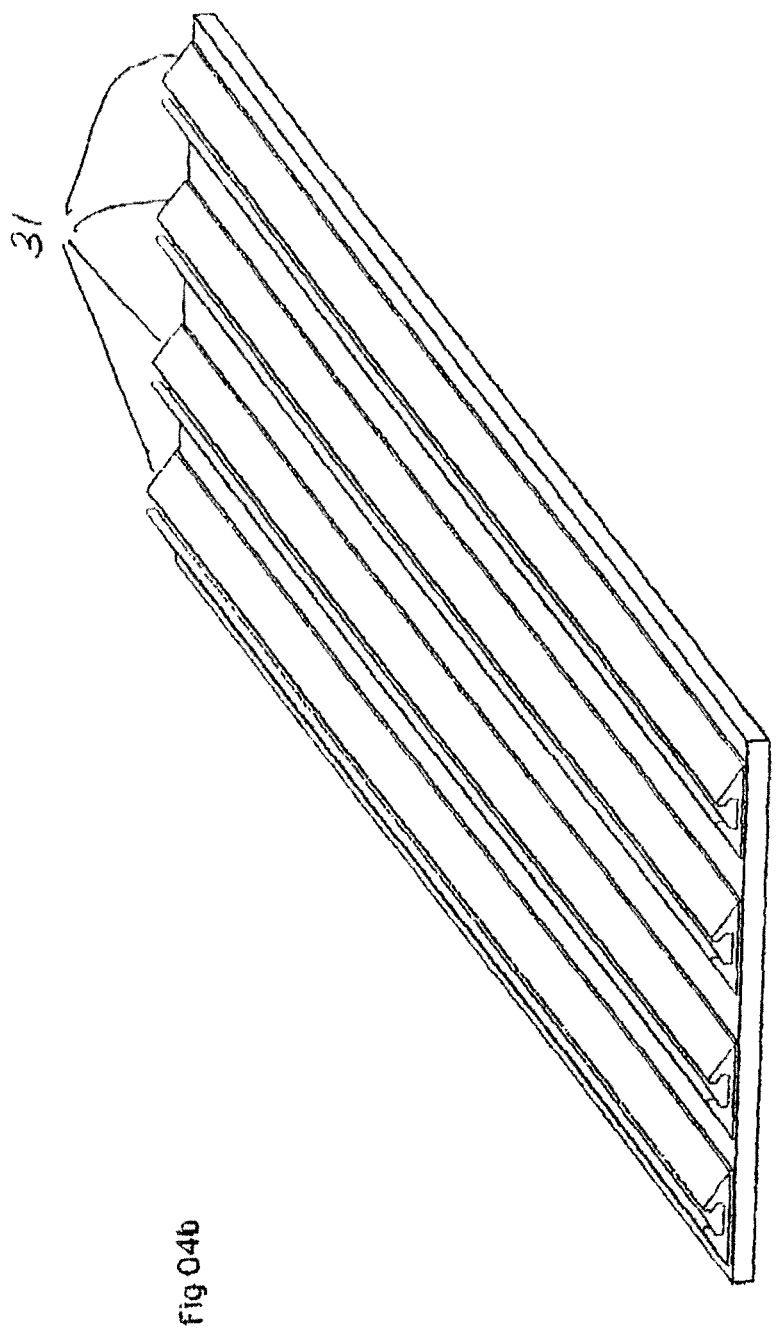

As shown in FIG. 1 (not to scale), a photovoltaic panel 15 has for its outer side a glass superstrate 10. This superstrate covers an array of series-connected individual photovoltaic ("solar") cells 11 which are embedded in an encapsulant 12. The encapsulant 12 may be of Ethyl-Vinyl-Acetate (or EVA). A back sheet 14 is attached to the inner side of the encapsulant 12; and the glass 10, cells 11, encapsulant 12 and back sheet 14 are laminated together to form the panel 15. The back sheet 14 is typically made of PET (Polyethylene terephthalate) with or without additions of glass fiber reinforcement. However, other materials can also be possible e.g. Polypropylene, Polyamide, Ethylene Vinyl Acetate, Polyethylene, Polycarbonate, or combinations of these.

The polymer based, PV laminate back sheet provides an outer protection layer against mechanical forces and water ingression etc, but also serves to electrically insulate the solar cell circuitry. PV back sheets are commercially available in many different forms and materials. The back sheet typically has a thickness in the range between 0.2-0.5 mm, it can be manufactured by joining multiple films or by co-extruding several layers. Thus different properties can be achieved. In high volume manufacturing the material selection is also very much governed by cost.

In the present invention a back sheet that has similar (including the same) thermal expansion co-efficient as the polymer rails/pads (attachment features) is used. As a particularly relevant example the combination of a PBT (poly butylene therephtalate) back sheet and attachment features made of polycarbonate may be used. Both materials may have a thermal expansion coefficient of approximately $65\text{-}70 \times 10\text{e-}6/K$. Polycarbonate is also available as back sheet material and would thereby be identical with the rail material.

Polycarbonate is currently the preferred choice of rail material, due to its toughness, transparency, yield strength and high temperature properties. PBT and polycarbonate have compatible melting points and have favorable relative thermal index (RTI) values. RTI is a definition employed by UL (underwriters laboratory) to characterize a materials ability to withstand high temperature. The latter is relevant for fire resistance and flame retardant abilities in electric devices.

FIG. 2 shows a first embodiment of the invention. The laminated panel 15 has a back sheet 24 which is formed integrally with an attachment feature 21. The feature 21 stands out slightly from the back sheet (e.g. by between 1 mm and 25 mm), and has two lips 22 arranged to limit access to a central slot 23 (recess). This figure shows a support formed as an aluminum 'I' beam 25. The upper flange 26 of the 'I' beam 25 fits into the slot 23. (The configuration of the slot 23 can be designed specifically to accept standard sized flanges 26.) It is important that the flange 26 fits securely into the slot 23. The 'I' beam 25 in this case forms part of a support structure (not shown but lying beneath the 'I' beam) for the panel 15. The attachment feature 21 permits easy on-site assembly of the panel 15 onto the support structure which may be a roof, tracker or ground mounted structure. Roofs may have flat or corrugated surfaces, tiles or shingles. Additional features may be added to prevent loss of the panels by theft or unintentional sliding.

The back sheet with integral attachment feature(s) can be formed by a process such as extrusion in which an extrusion die has a cross section which is similar to that of the back sheet and feature(s) (for which see FIG. 2). This is advantageous where the feature(s) are to extend the full length of the back sheet as in the case of a strip.

Other embodiments are also envisaged for providing secure attachment of the attachment feature(s) with the back sheet. For example in one such alternative, where it is desired to use a different polymer material for the formation of the feature in comparison with the back sheet, then, again the back sheet and feature(s) may be formed simultaneously by a co-extrusion process. In this case the two compatible polymers are co-extruded and one polymer substantially forms only the planar part of the back sheet with the other polymer forming the feature(s). As a further example alternative embodiment, the feature(s) may be mounted to the back sheet subsequent to the production of the back sheet itself. A polymer welding process may be utilized to achieve this. It will be appreciated that, in this case, the polymer material of the back sheet and the feature(s) may be same material. In other cases the materials may be different polymers (which are nevertheless compatible for welding purposes). The provision of a separate joining process (in this case welding) is advantageous in that it allows the is mounting of feature(s) having more complicated geometries.

FIG. 3 shows a second embodiment of the invention.

In this case the planar back sheet is wholly incorporated into the laminate 15A. An attachment feature 31 is joined to the back sheet 34 with an adhesive 37. The configuration of the attachment feature 31 is similar to the feature 21 shown in FIG. 2. Lips 32 limit access to a central slot 33, which on assembly fits around the upper flange 36 of an 'I' beam 35. Whilst an adhesive may be used to bond compatible polymers it also provides advantages in bonding polymers which may not be directly compatible for welding purposes.

FIGS. 4a and 4b show rear views (non-insolation side) of panels according to the invention.

FIG. 4a shows two attachment features (such as 31 in FIG. 3) bonded in spaced parallel relationship to the back sheet of a PV panel 15, and FIG. 4b shows four similar attachment features bonded to a similar panel. The cross sectional shapes of the attachment features and their relationship to the panel as a whole are shown clearly in FIGS. 4a and 4b which are not to scale.

In FIGS. 4a and 4b the attachment features (strips) are positioned in parallel with each other and in the longitudinal direction of the rectangular panel. It is of course possible to position the strips in many other positions relative to each other and the panel.

FIG. 5 shows a rear view of a panel mechanically joined to support rails (support structure). In this case two 'I' beams 35 are in engagement with the features 31. The panel is shown upside down, and in service the 'I' beams 35 would be fixed to a roof structure or other structure. Following construction of the roof, the panel 15 would then be fixed to the 'I' beams.

FIG. 6 shows two panels 15a and 15b mechanically joined to common support rails 35. There are spacer elements 15c between the panels 15a and 15b that provide a certain distance between adjacent panels. In addition, such spacers provide a gap for air circulation allowing the panels to operate at lower temperatures with higher efficiency. A spacer can separate the panels by an appropriate distance, e.g. 2-15 mm. Alternatively, the strips (attachment features) may extend slightly beyond the length of the panel, thus providing the said gap between adjacent panels when installed.

The attachment features need not be continuous, and FIG. 7 shows four spaced features 31a, b, c, and d bonded to the back sheet of the panel 15. Features 31a and 31d are in alignment, and features 31b and 31c are in an alignment spaced from and parallel to the alignment of features 31a and 31d. This enables the panel to be fixed to a support structure at several spaced apart 'I' beam supports on the support structure.

FIGS. 8a, 8b and 8c show cross sections of panels and profile elements attached to a corrugated roof.

In FIG. 8a, a panel 15 has an attachment feature 31 (as in FIG. 3) joined to the back sheet of laminate 15A. The panel is to be fixed to and supported by a corrugated roof 71. In this case a profile element 75 (dimensioned to fit within the feature 31) is glued directly to an upper surface of an upwardly directed corrugation 76 of the roof with adhesive 77. The corrugated roof is assembled in a conventional manner. The panel 15 is transported separately to site, and is slid into engagement with elements 75 arranged at a suitable spacing on the corrugated roof.

In FIG. 8b a similar arrangement is effected by a profile element 78 comprising a screwed fastener which is driven through the corrugated roof 71 into a structural beam 79 supporting the roof The attachment feature 31 this case engages the head of the profile element 78a. The profile elements are arranged at a suitable spacing on the corrugations of the roof.

In FIG. 8c a profile element 80 is formed integrally with an upper surface of an upwardly directed corrugation of the roof. The profiled elements 80 stand above the heights of the standard corrugations.

Profile elements similar to the ones shown in 75 or 80 can also be integrated or form an integral part of other roofing materials such as corrugated metal plates with other shapes, ceramic roofing tiles, corrugated plastic plates, corrugated asphalt plates, or asphalt shingles.

Figure 9:
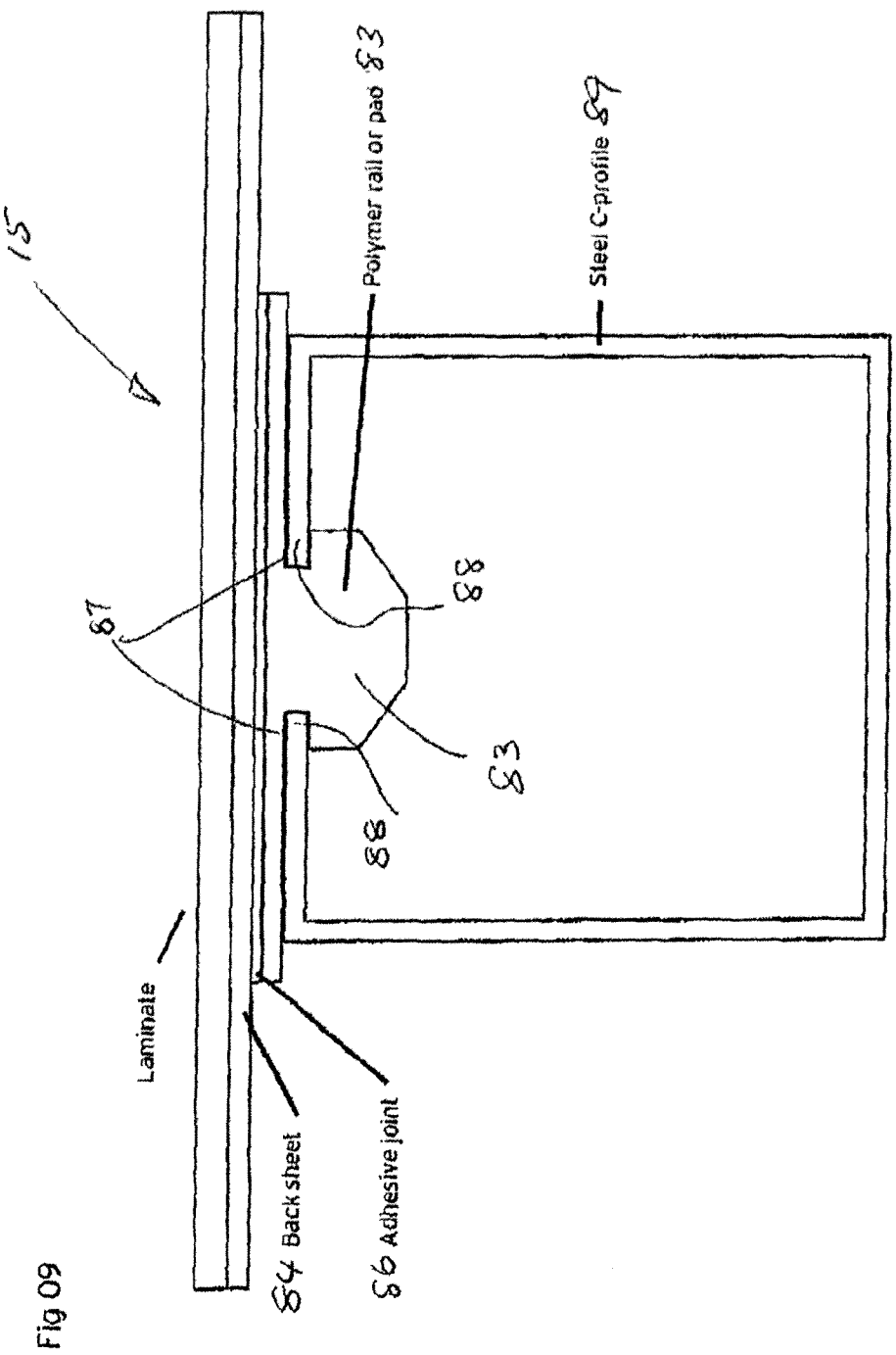
FIG. 9—showing a third embodiment—is a cross section of a laminate engaged with part of a support structure, FIG. 10—showing a forth embodiment—is a similar cross section.

FIG. 9 shows a third embodiment of the invention. A glass superstrate overlies a PV cell which in encapsulated in a layer of EVA. Back sheet 84 is laminated with the glass and EVA layers to form an integral laminate panel. An attachment feature 83 is bonded to the outer side of the back sheet with adhesive 86. In this case the attachment feature has opposed slots 87 in its outer surfaces, so that engagement can be effected by two inwardly facing opposed edges 88. The edges 88 are formed on an open 'C' profile steel support member 89. The edges are the opposed ends of the open profile, and the upper faces of that profile lie directly below portions of the attachment feature 83, so to give direct support to the laminate above the adhesive 86.

Figure 10:
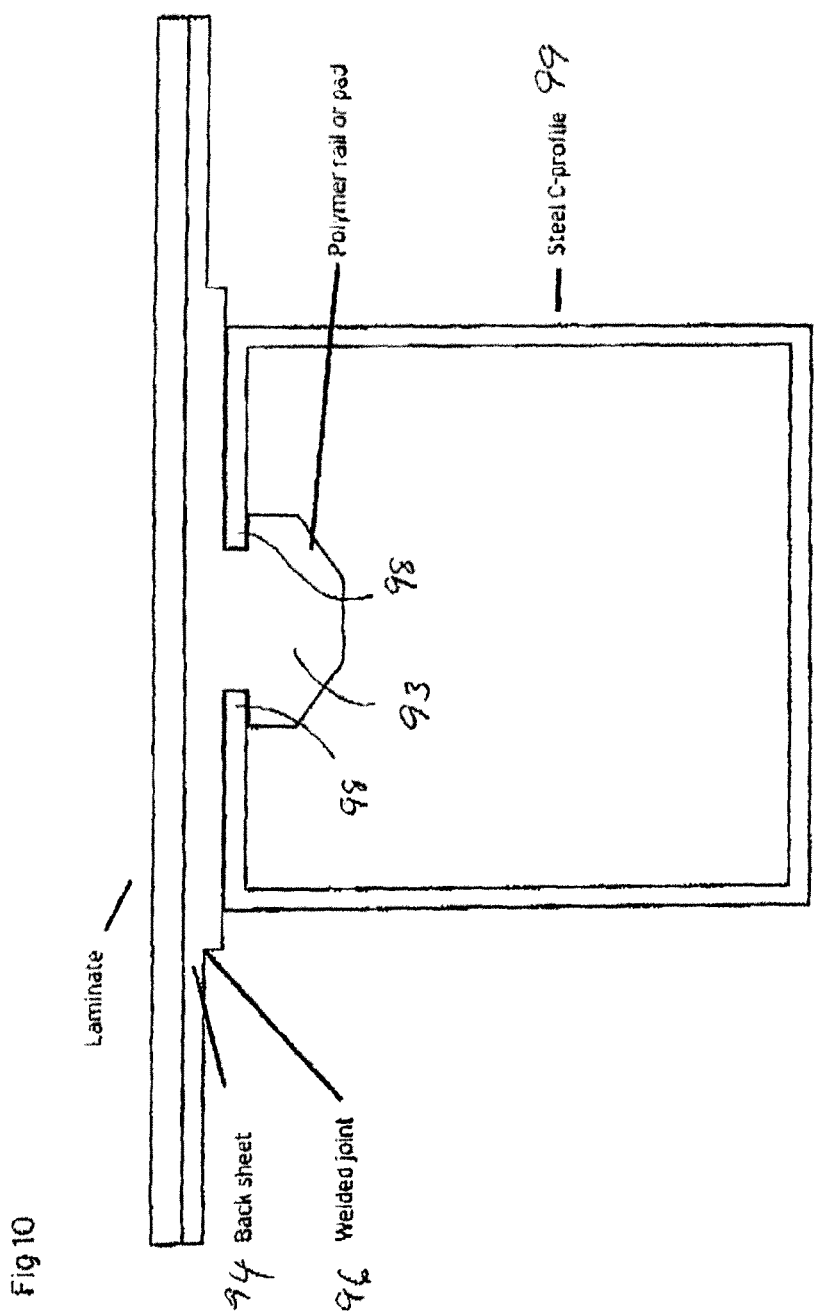

FIG. 10 shows a forth embodiment of the invention. This is similar to the third embodiment, except that the upper faces of the attachment feature 93 are welded directly to the back sheet 94 at a welded joint 96. As with the third embodiment, the edges 98 of an open 'C' profile steel support member 99 underlie and support the laminate above the welded joint 96. As an alternative to welding, the attachment features can be extruded as an integral part of the back sheet.

Figure 11:
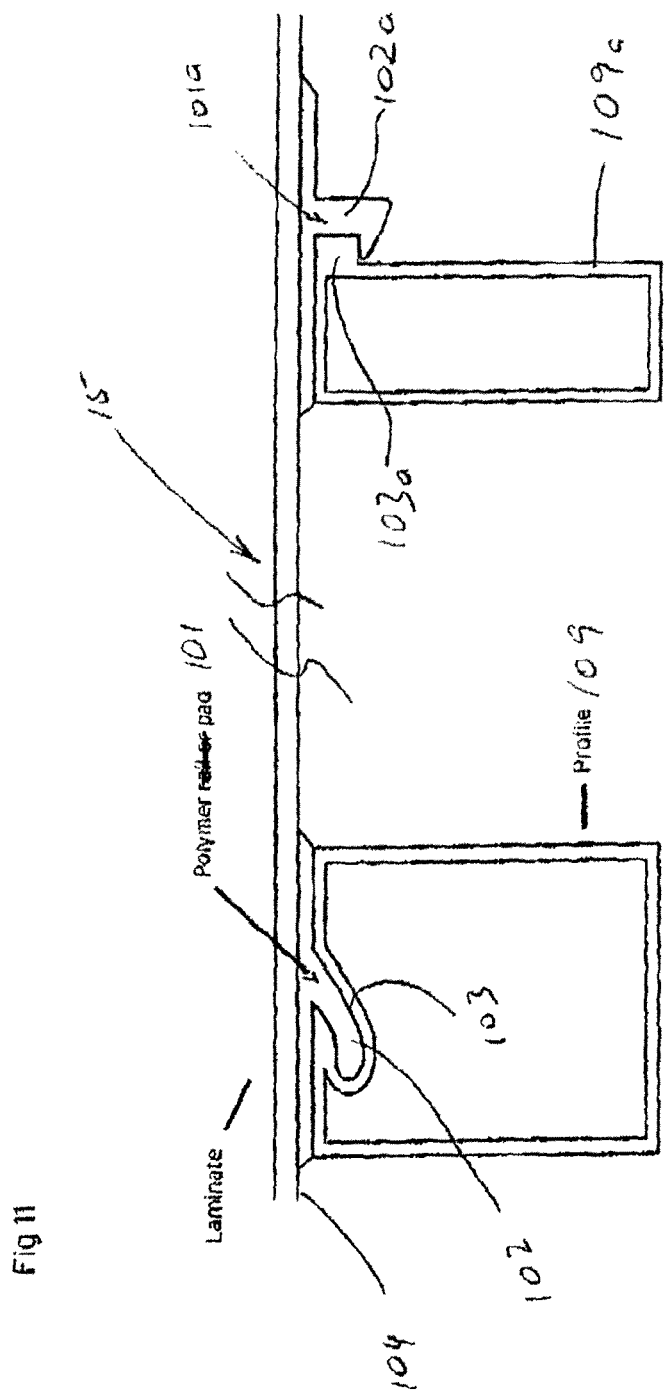
FIG. 11 shows a fifth embodiment in cross section, with a "hinged snap-on"

FIG. 11 shows a panel 15 fitted with differently shaped strips (attachment features) close to its respective side edges. Appropriately shaped supporting profiles/rails are required to have been fitted to the support structure (e.g. roof) 15 during construction. This arrangement enables a "hinged and click-in" mode of engagement. The strip shown on the left side in the figure will function as a hinge lock. This has an elongated polymer pad 101 secured to (or integral with) the back sheet 104 of the panel 15. The pad 101 has an attachment feature comprising a downwardly sideways directed spur 102. The spur 102 is configured to engage with a corresponding slot or groove 103 in a closed support member 109. The strip shown on the right side in the figure has a snap-on or click-in function. Polymer pad 101a has a ratchet type spur 102a to engage with a corresponding lip 103a outstanding from the side of a closed support member 109a at its upper edge. This enables fast and easy mounting of the panel without the need of using tools. The panel is first engaged with the left hand spur 102, is rotated downwardly hinged about that spur, and is then moved into engagement with the right hand spur 102a on the support member 109a.

Figure 12:
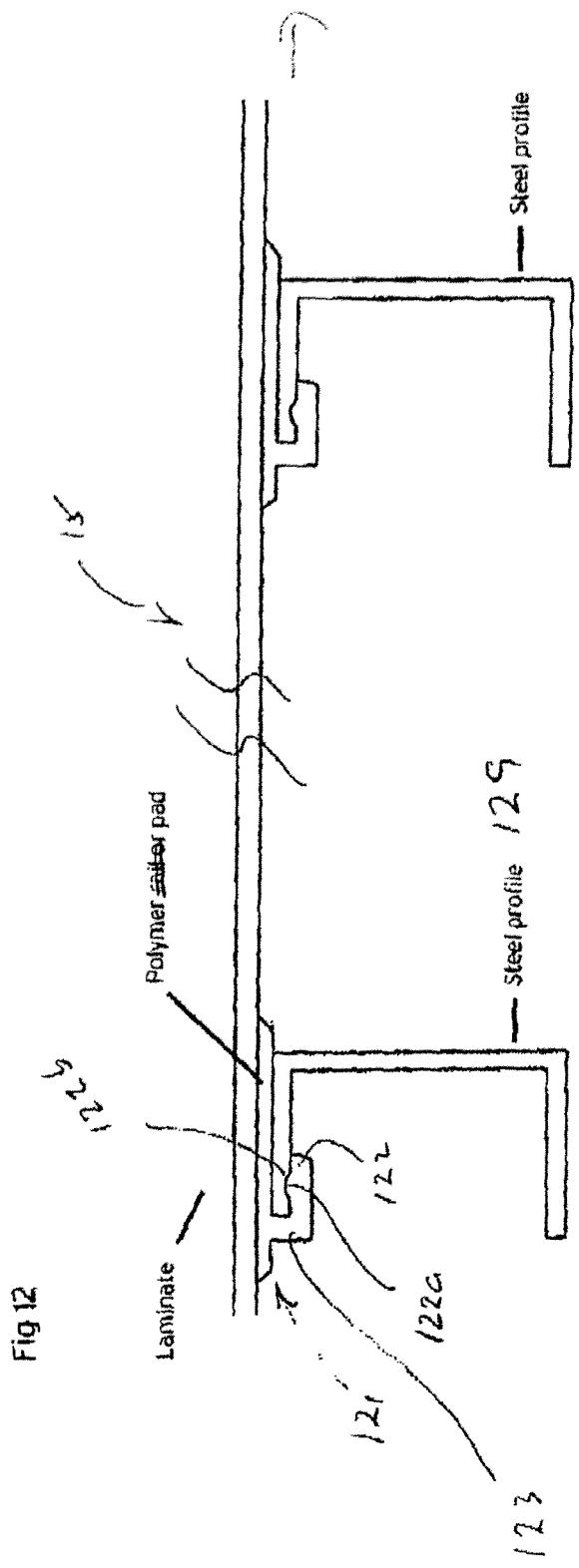
FIG. 12 shows a sixth embodiment in cross section, with a "sideways slide-in", FIGS. 13a, b and c show cross sections for three examples of the attachment feature.

FIG. 12 shows a panel 15 equipped with identical strips or pads 121 close to its respective side edges. The strips or pads 121 include attachment features 123 which 30 have downwardly sideways directed reentrant spurs or grooves 122 with locking projections 122a running along their inner upwardly directed surfaces. Steel 'C' beams 129 are fixed to the support structure (e.g. roof) during construction. The parts of the upper flanges of the 'C' beams engaging with the spurs 122 have slots or grooves 129 to engage with the locking projections 122a. This arrangement enables a "sideways snap-on" type of assembly to install panels on a roof.

Figures 13A, 13B, 13C:
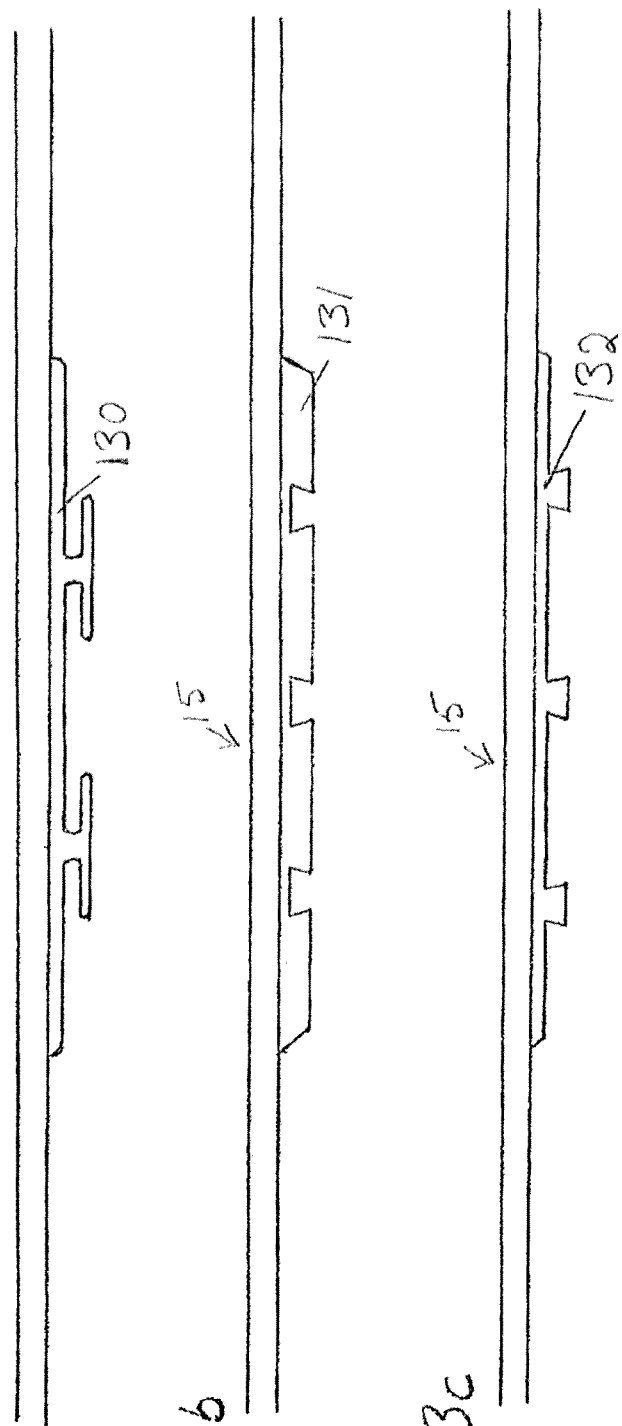

FIG. 13a, shows a cross section of a polymer strip 130 that may connect to multiple support rail geometries e.g. a single I-profile or e.g. an open channel shape or C-profile. In FIG. 13a a strip with two protrusions is shown. There can, however, be one, three or more protrusions on the same strip. FIGS. 13b and c show cross sections of strips 131, 132 with grooves and protrusions, respectively. In FIG. 13b a strip with three grooves is shown. There can, however, be one, two or more grooves on the same strip. In FIG. 13c a cross section of a strip with three protrusions is shown. There can, however, be one, two or more protrusions on the same strip. It is of course also possible to combine protrusions and grooves on the same strip.

FIGS. 14a and 14b show cross sections of other embodiments of strips 133, 134 with grooves and protrusions, respectively. The grooves and protrusions have a generally circular cross section. In FIG. 14a a strip with three protrusions is shown. There can, however, be one, two or more protrusions on the same strip. In FIG. 14b a strip with three grooves is shown. There can, however, be one, two or more grooves on the same strip. It is of course also possible to combine protrusions and grooves on the same strip.

FIG. 14c shows a cross section of a strip 135 (similar to the strips shown in FIGS. 2 and 3) and corresponding support rail. The metallic surface of the upper flange of the support rail in contact with the polymer surface is provided with small grooves for reduced surface friction upon insertion. FIG. 14d shows a cross section of a strip 136 where the surface of the polymer strip is modified with grooves to reduce frictional forces by reducing the contact area upon insertion. This technique of providing grooves may be used for all embodiments in which a sliding action is used for installation.

FIGS. 15a-d show examples of various shapes of the polymer strips and pads and various positioning and orientation of the strips and pads on the panel. It is of course possible to place the strips in other positions on the panel. It is also possible to have different numbers of strips than the number of strips shown in these figures. All strip and pad variants can typically be equipped with the grooves and slots described above and shown in previous FIGS. 13a-c and 14a-d, for connection of the correspondingly shaped features (metallic stiffeners) of the support structure.

Figure 15A:
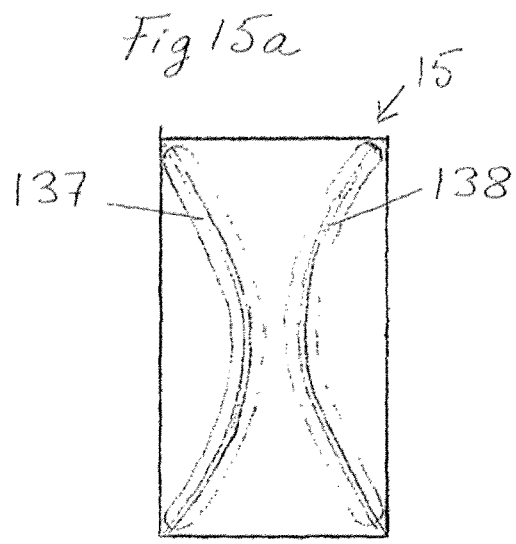
FIG. 15a-d show examples of shapes of the polymer strips and various positioning of the strips on the panel.

FIG. 15a shows a panel with two curved strips 137, 138

Figure 15B:
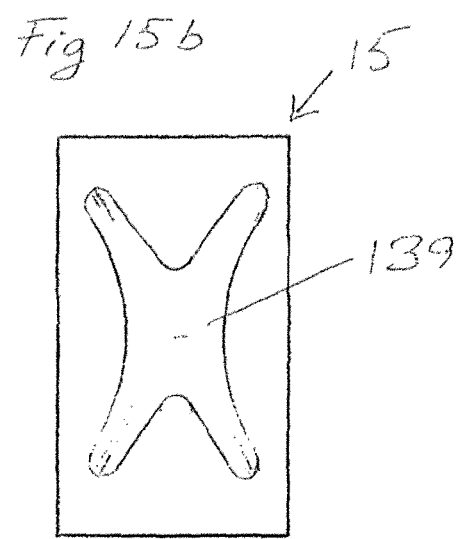

FIG. 15b shows a panel with one pad 139 with an X shape

Figure 15C:
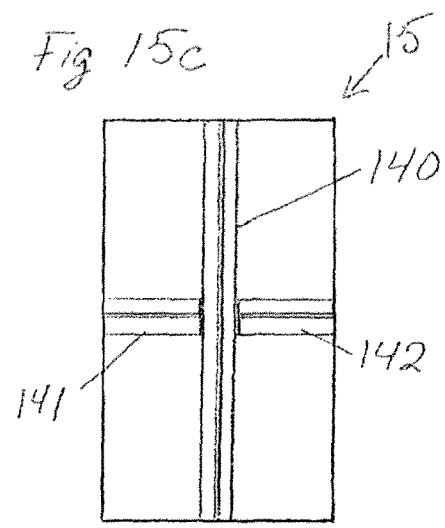

FIG. 15c shows a panel with one strip 140 positioned centrally in longitudinal 30 direction of the panel, and two shorter strips 141, 142 positioned centrally in transverse direction of the panel.

Figure 15D:
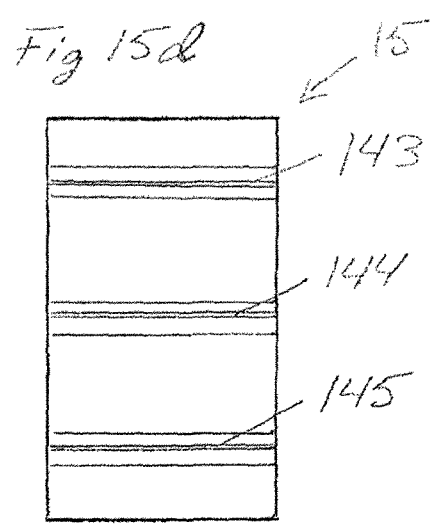

FIG. 15d shows a panel with tree strips 143, 144, 145 positioned in transverse direction of the panel.

In any of the embodiments where the attachment features are not fully integrated into the back sheet, the attachment feature can be joined to the laminate by adhesive methods such as gluing (silicone, epoxy, acrylic . . . ) or taping. Alternatively, the non planar feature can be welded onto the back sheet. The welding can be performed with well established techniques such as laser welding, hot plate or hot tool welding, friction, spin or vibration welding, induction welding, ultrasonic welding, hot gas welding, high frequency welding or other joining methods.

Physical welding of parts is often considered a better joining method when compared to tape or glue. Particularly in view of the long warranty periods of up to 25 yrs for PV panels. In the present context the welding process does not utilize any consumables in the joining process. The latter is important in order to keep manufacturing costs low.

In order to laser weld the parts, the laser light must be absorbed in the joint. In one embodiment this is achieved by having a black (absorbing at approximately 940 nm diode laser light) back side. The laser light goes through the transparent polycarbonate attachment feature. The two-colored PBT back sheet has a white reflective front towards the sun to improve PV efficiency. Alternatively, one side of the polycarbonate rail can be colored black by the use of ink jet printing or other application techniques. The pigment may typically consist of carbon black. With this configuration the back sheet can be white on both sides, which may help to reduce costs.

For laser welding the back sheet and attachment features are preferably is comprised of polycarbonate.

Figure 17A:
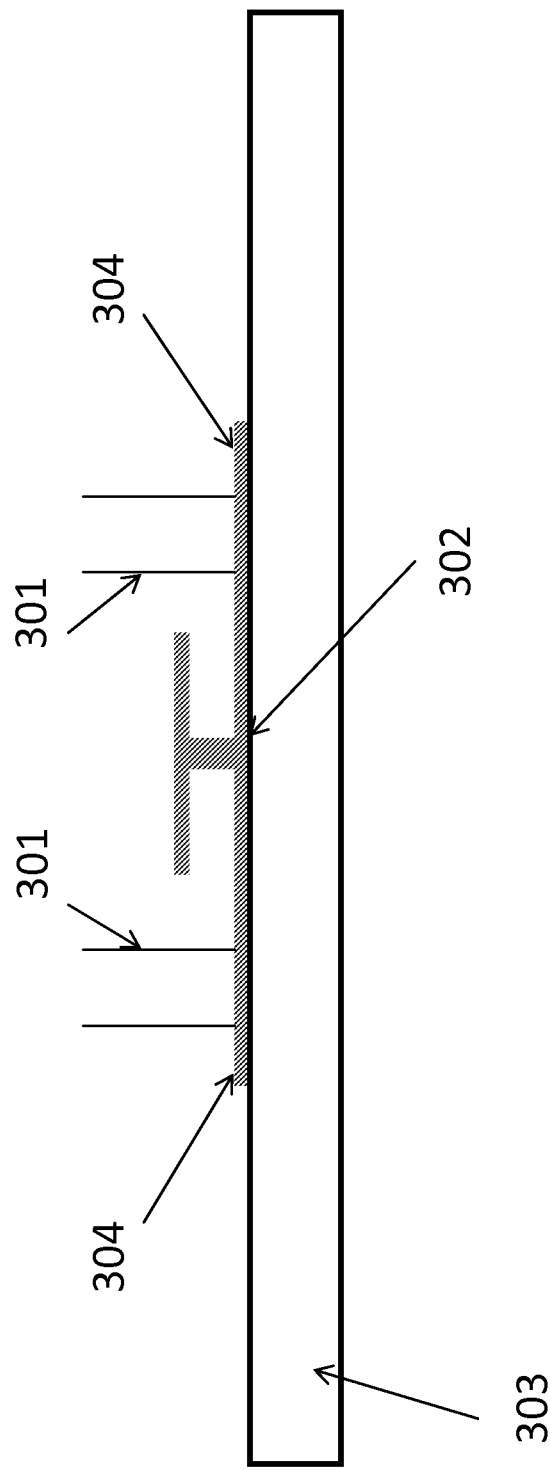
Figure 18:
FIGS. 18 to 25 show various views of the photovoltaic panel and the support structure.
Figure 19:
Figure 20:
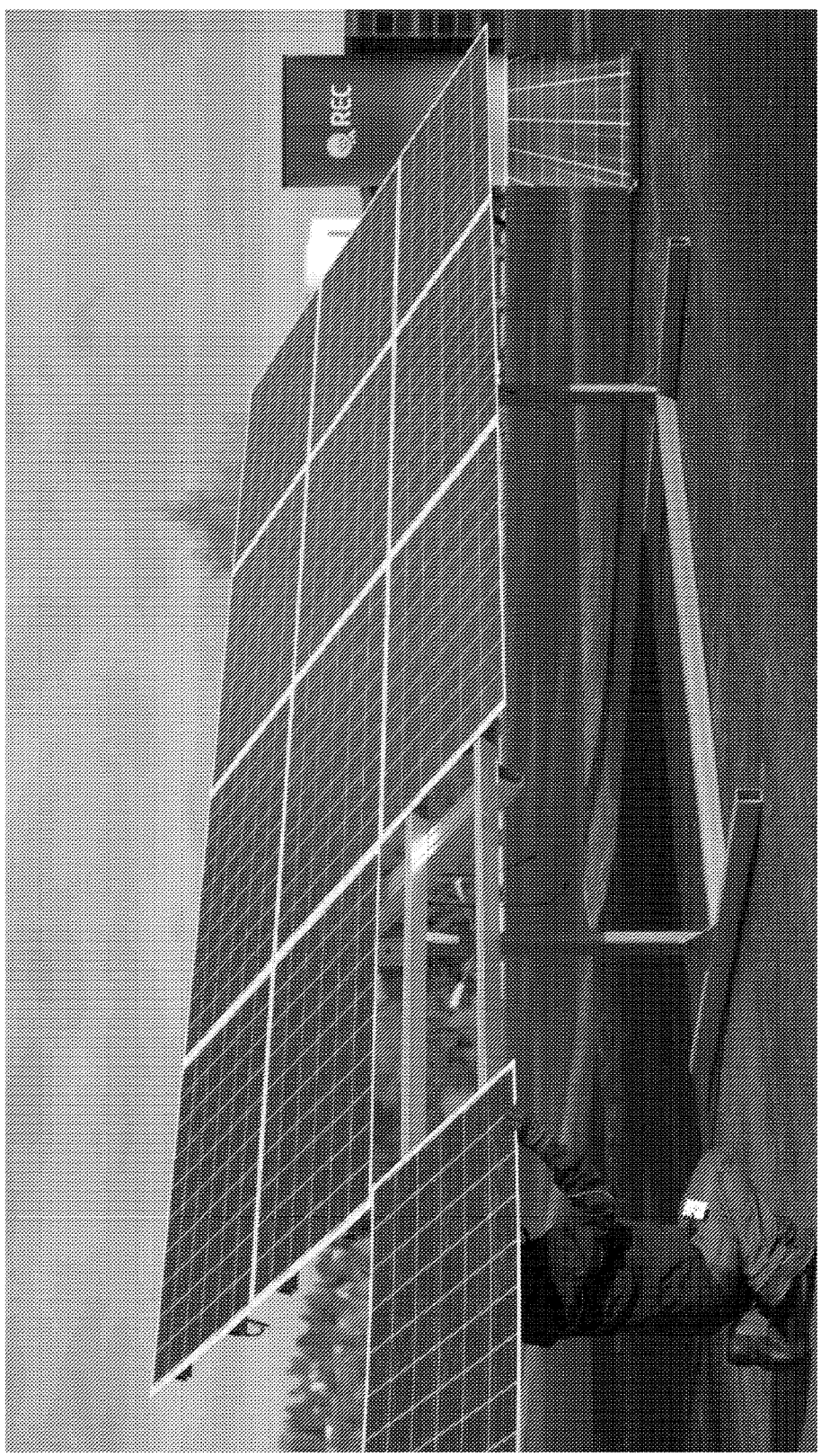
Figure 21:
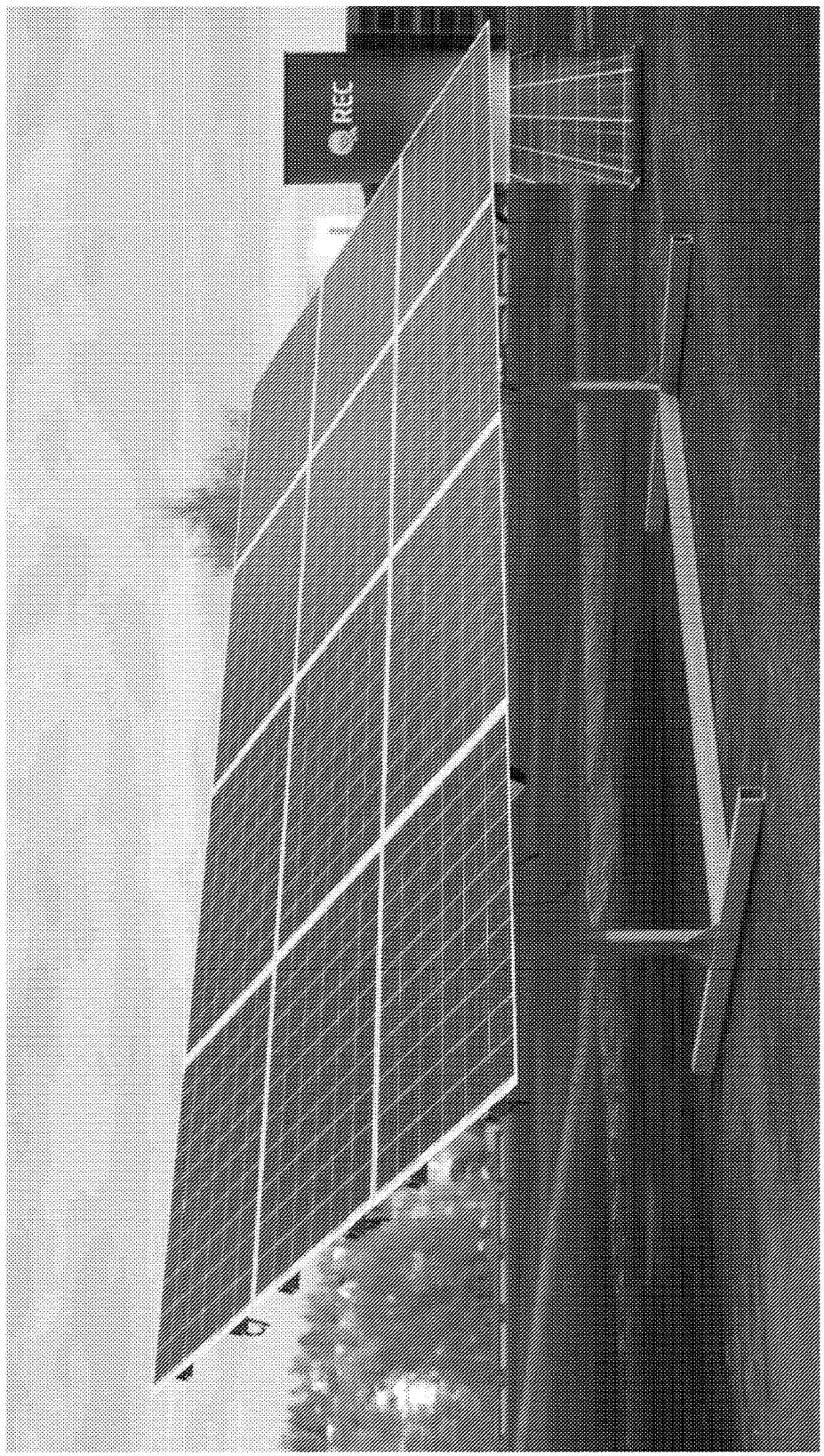
Figure 22:
Figure 23:

FIG. 17a shows a schematic diagram of a laser welding process. Infra-red frequency laser beam 301 travels essentially uninterrupted through the infra-red (IR) transparent attachment feature 302. More than one laser beam may be used simultaneously as is shown by the second instance of the laser beam 301 in FIG. 17a. The laser beam is typically directed through IR transparent flanges 304, these being positioned symmetrically upon each side of the feature 302. Heat is generated as the laser beam 1 is absorbed in the IR absorbing part of the PV back sheet 303.

FIG. 17b shows a schematic representation of an attachment feature being laser welded to a PV back sheet using parallel processing with multiple welding heads (not shown). The attachment feature 302 is held in contact with the PV laminate 303 with a predetermined pressure to ensure a good contact. The pressure can be exerted through a highly transparent glass or quartz device in order for the laser beam not to lose power prior to reaching the light absorbing interface. The laser welding head typically travels at a speed of 80-200 mm/second although other speeds are possible. Thus it is possible the make long weld seams on the back side of the PV panel in short time. The laser beam 301 is directed through the IR transparent flanges 304 of the attachment feature 302. The laser beam heats an IR absorbing region of the PV back sheet (shown at 305) and through heat conduction the joint interface is heated to the required temperature and a permanent polymer laser weld is formed between the two parts. Region 305 denotes either: a layer of additional absorbing material which is different from and applied to the back sheet substrate; a layer of the back sheet substrate having embedded laser-absorbing material within the back sheet "matrix"; or simply the penetration depth of the laser within the substrate in which all of the material has laser-absorbing properties.

The laser beam can travel parallel to the attachment feature and thus create an elongated weld seam. This is particularly appropriate for elongate attachment features such as those in the system shown in FIGS. 18 to 25.

In a practical example, the welding machine consists of a fixture/table for positioning of the PV panel. The laser transparent attachment parts are then positioned onto the back side of the PV panel and held in place by a fixture.

One or several weld heads equipped with laser optics are guided by articulated robots, or a linear axis, across the back side of the panel and weld the attachment parts onto the back side. The welding head may be designed to fit the cross sectional geometry of e.g. elongated polymer rails and thus serve to provide a good geometric alignment of the rail on the back side of the panel.

The process is typically completed in less than a half a minute after which a new PV panel can be inserted into the machine. Feeding of panels and attachment parts is conducted either manually or automatically.

A suitable laser power range is from 50 to 200 W per individual weld head source although other power outputs may be used. Diode lasers with curtain type focal points widths between 4-10 mm, and 900-1000 nm wavelength, may typically be used.

In this and other embodiments, the height of the attachment feature can be between 1 mm and 25 mm, preferably between 1 mm and 18 mm, more preferably between 1 mm and 13 mm and most preferably between 1 mm and 8 mm.

The polymer material of the strips also provides as a suitable surface for text, bar code, trade mark, branding or color coding of the product etc. The elongated strips and corresponding support bars can optionally be fitted with imprints, holes or protrusions at even intervals. Such imprints or protrusions may serve as fixation points along the rails for individual panels ensuring necessary panel interspacing to accommodate geometric tolerance stack up inherent in the panel itself and the support structure.

Figure 16:
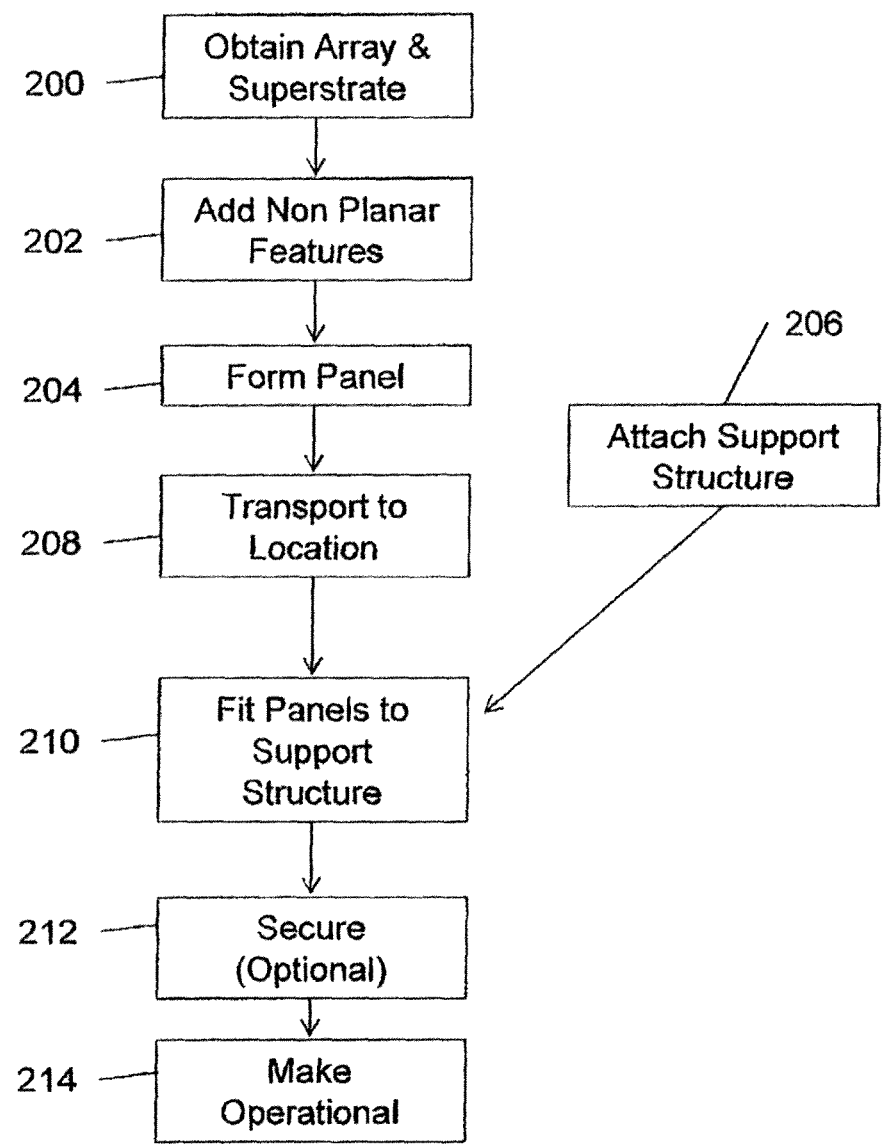
FIG. 16 shows a schematic flow diagram of a fabrication and installation method suitable for use with each embodiment.

With reference to FIG. 16 a method of fabricating and installing the panels is described. At step 200 at a photo voltaic generator panel production facility, one of numerous photo voltaic cell arrays is manufactured and the glass superstrate provided. At step 202 the back sheet polymer material is provided with attachment features. The back sheet might be formed with the features in a simultaneous operation (such as extrusion) or they may be provided at a different time (for example using laser welding as described in association with FIGS. 17a, and 17b). At step 204, the photo voltaic generator panel is laminated together including the 20 superstrate, cell array and back sheet with non-planar geometrical features. Following further finishing and packaging processes the PV panel is packaged, together with others, for transportation to a remote installation location. Meanwhile, independently, at the installation location, a building is prepared for installation of PV generator panels. At step 206 a support structure is provided to the building (such as the attachment of mounting rails to the building roof). At step 208, the PV generator panels are transported to the installation location. Then, at step 210, the panels are fitted to the mounting rails, for example by a slide fitting, hinging and/or snap-fitting process. An optional securing step is performed at step 212 to prevent theft of the panels or movement of the panels in the event of a malfunction. Finally at step 214, the panels are connected electrically and made operational.

In all of the embodiments described above, the attachment features 21, 31, 83, 93, 103, 103a 123, 130-136 are assembled with the laminated solar panels in a closely controlled, high volume manufacturing environment. The support members 24, 34, 89, 99, 109 and 129 are fixed to or form part of the roof structure or other support structures when it is constructed on site. The panels are brought to site and fixed to the structures as the PV system is installed.

Any of the features in any of the embodiments can be combined with any of the other features in the other embodiments whenever suitable. For example the small grooves enabling low friction during installation as shown in FIGS. 14c and 14d can be used in any of the other strips or mounting rails.

Advantages of the Invention

The invention provides a frameless PV panel with sufficient structural strength when installed. Moreover, the structural capacity can be optimally adjusted to fit regional requirements by dimensioning of the support members. Compared to known panel designs, the concept enables further reduction of the front glass thickness of the PV panel. Panels according to the invention allow more compact consolidation for transport, and reduce mechanical forces arising from different thermal expansion coefficients between dissimilar materials. A transmissive laser welding technique may be used advantageously to attach the attachment features to the back sheet. When connected to the appropriate support rails and accompanying support structure, the product can be efficiently designed to cope with the load bearing requirements. The present invention enables low deflection of the panel upon loading with minimum use of material, thus providing a durable and cost effective product.

When the polymer strips have a certain height they may function as a natural gripping edge for installers during handling. The installer may also insert a specially designed carry handle into the strip for carrying.

The fast attachment methods of panels onto the support rails will reduce overall installation time. Moreover it will eliminate traditional fixation elements in form of clamps, bolts and so on, together with any associated tools for use with such elements.

Moreover, the PV panels can be stacked denser during transport and the packaging volume can be reduced by more than 50% compared to conventional PV panels. It is expected that the accumulated benefits may reduce the cost of PV panels installed at site by 5-10%. This is a substantial contribution in the effort to make PV more available.

PRACTICAL EXAMPLE

We now briefly describe a practical implementation of the invention, originating is from the present applicant. The advantages of this system are also discussed. However, it is intended and will be understood that the features of this implementation are readily combinable, where possible, with each aspect and example set out in the earlier discussion, whether individually or in combination. The photographs of FIGS. 18 to 25 show various aspects of the installation of the system.

Figure 24:
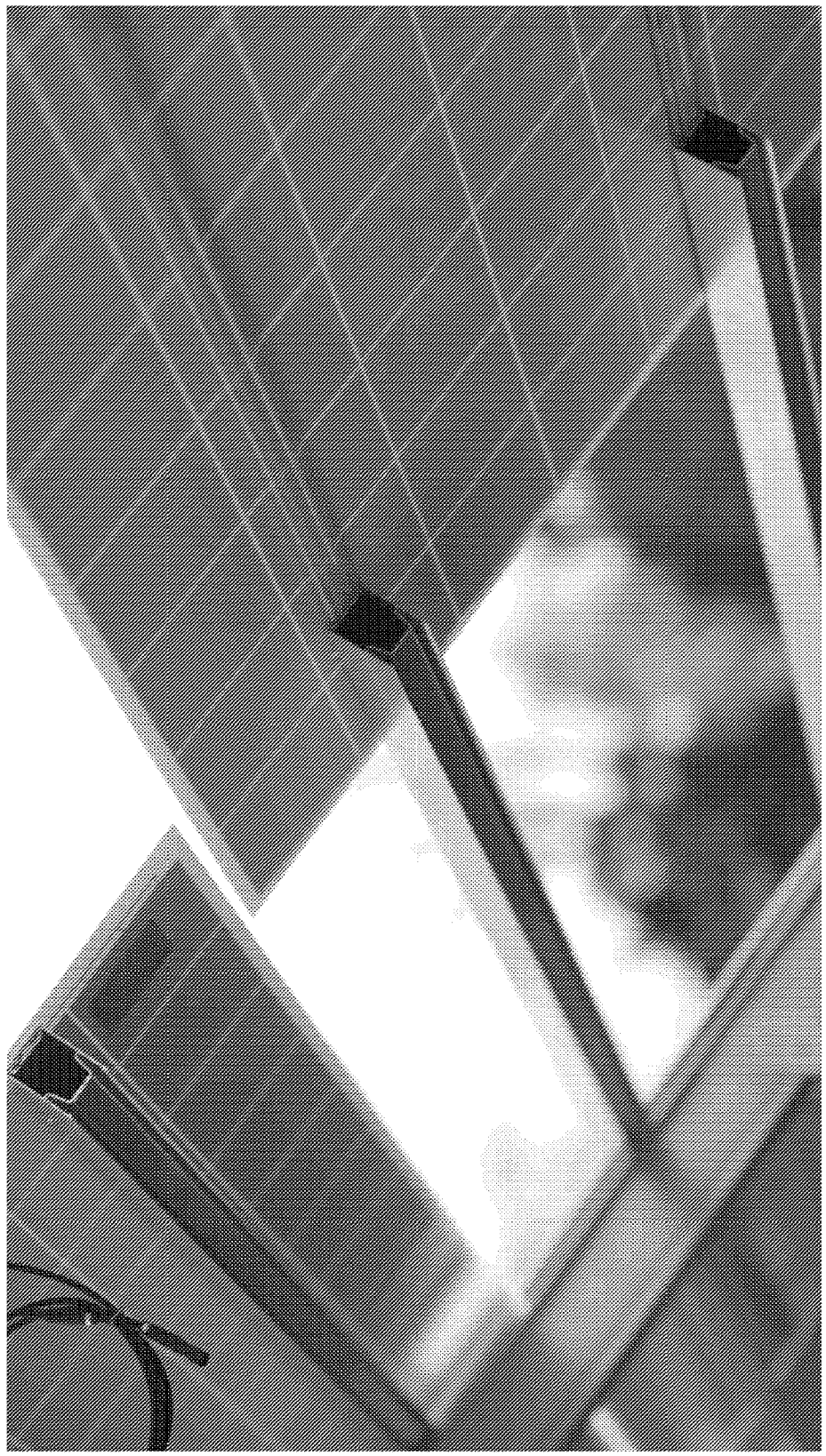
Figure 25:
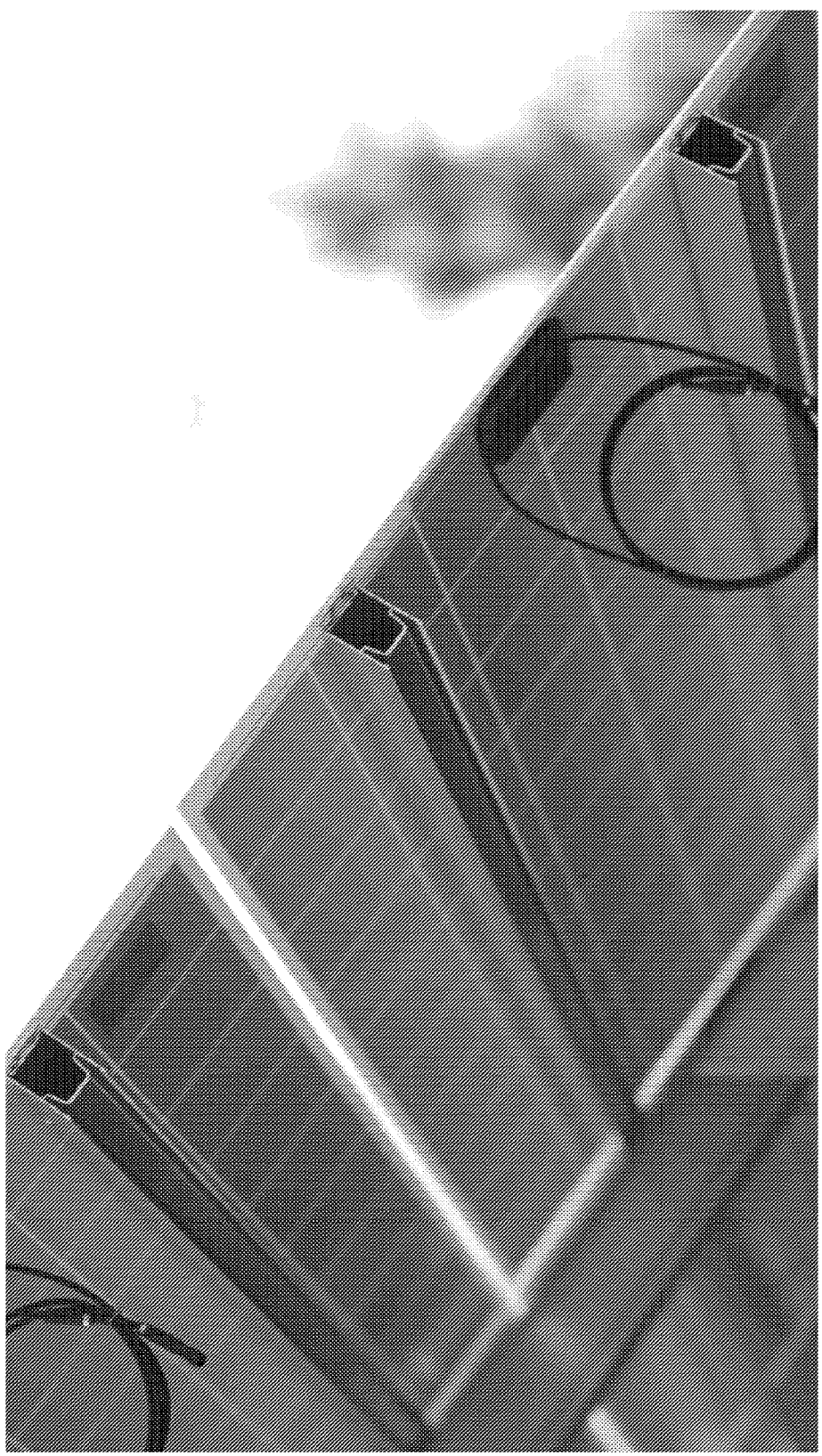

The system combines frameless high performing PV modules with an aluminium under-construction to deliver a cost effective and easy to mount PV solution for large scale projects. The arrangement can be seen clearly in FIGS. 19 and 20. UV resistant polymer rails (attachment features) which are laser welded onto the laminate, easily slide directly into the under-construction (support structure) as shown in FIG. 24, eliminating the need for grounding, clamps and tools. The movement of materials that reduces power output is therefore reduced.

Benefits include improved performance, safe, quick and easy installation, cost reduction and a lighter carbon footprint. More robust, the solution performs in all weathers preventing snow load effects and Potential Induced Degradation (PID). Reducing glue, metals, time and expertise needed in installation while introducing a light and less bulky design, reduces costs. With this complete solution, PV technology is made less costly, accessible, sustainable, and longer lasting.

Combining a frameless module with under-construction, laser-welded polymer rails and slide in installation is a unique approach. Eliminating the frame, clamps, tools and metal rails/rods connected to the back sheet is a first. Replacing metal rails glued to the laminate with polymer rails, more securely laser-welded, is an improvement on existing solutions that improves overall product quality. As the polymer will not degrade, the overall quality of the product over the long term is improved, as is its operational lifetime. Robust connectivity and a stiffer design prevent the expanding and contracting of materials and power loss in a unique way that also improves quality. Specifically, the stiffer design and improved connectivity limits cell breakage and movement, reducing power loss while ensuring performance in rain, wind or snow.

Eliminating the frame prevents PID and reduces power loss thereby improving product performance and quality, while using a non-degradable polymer will increase the lifetime of the module. Eliminating frames and adhesives while using efficient welding, and cutting installation costs, reduces overall system costs dramatically.

Designing a solution that is less bulky so that more modules can be delivered on one palette is a creative approach to reducing transport costs and the carbon footprint of PV.

Easy slide in installation is a creative way to improve installation quality, speed and costs. The solution makes the installers' job easier as tools, clamps and bolts that are difficult to tighten are replaced with rails that slide easily into place. The light weight of the solution also makes it easier to install. Not only can a single panel be slid easily into its final position on the support structure, in practice a number of panels can be slid into position simultaneously by one panel pushing an adjacent panel along the support structure.

Less production time is required during the manufacturing process as framing of laminates is eliminated, speeding up the production process. Less time is also required for transport as more modules can be transported at once, to trained installers, to install the solution or to repair the solution. The module will perform over a longer time with less maintenance required (as issues such as snow load effects and PID are eliminated), meaning less waste is produced. Providing the customer with a one stop system also reduces planning time.

REC modules have a leading carbon footprint and energy payback time of one year. The solution reduces this further by reducing materials and transport used. Furthermore, using less metal means less energy is needed.

The product makes PV technology "safer" as the risk of improper installation is is less. As less training is required to properly install the system the installers job is made easier.

The lower system cost as a whole makes PV a more competitive technology. Reducing the overall cost of the system will make PV more accessible to larger segments of society needing either ground or rooftop installations. In particular the solution makes PV more accessible to poorer tropical countries where energy needs are growing as PID is eliminated.

In terms of costs, removing the frame provides a five to ten percent reduction in overall systems costs. Reducing the expensive adhesives and clamps, bolts and tools further reduces costs. The time needed to manufacture a module by eliminating the framing of laminates and replacing this with efficient laser-welding further reduces costs. Reducing the cost of transport, speeding up installation time, reducing the need for repairs and the lifetime also provides an economic benefit. As energy and material costs are quite high, reducing these provides an additional economic benefit.

Reducing the cost of the overall system will help to encourage further investment in PV and more job creation for the sector which will deliver wider economic benefits. Overall this cost reduction will help to reduce cost of production making solar power a more competitive technology.

In 2011, 30% of all PV installations will be field projects which the REC solution is specially made for, with demand for field projects increasing. The solution can be adapted for roofs where there is strong demand as 68% of installations in 2011 are rooftop installations. The quantity produced is expected to be around 100 MW by 2012 depending on demand.

The invention provides the benefits of one robust, easy to install solution that delivers consistently high performance over time, reducing costs and carbon emissions.

The invention claimed is:

1. A method of fabricating a photo voltaic generator panel including a glass superstrate and a polymer back sheet with at least one attachment feature, so as to provide means of attaching the panel to a structural support upon subsequent installation, the method comprising:
    applying at least one polymer attachment feature to the outer side of the polymer back sheet of the panel during the manufacturing process for that panel such that the attachment feature projects with respect to the back sheet, the application being in conjunction with a lamination process, or subsequent to the lamination process, or as an integral part of the back sheet manufacturing process;
    wherein the at least one polymer attachment feature comprises two slots for engagement of the at least one polymer attachment feature and at least one feature of a support structure, the two slots comprising grooves for reducing the contact area between the at least one polymer attachment feature and the at least one feature of the support structure, and
    wherein the at least one polymer attachment feature and said outer side of the polymer back sheet have the same thermal expansion coefficient.

2. A method according to claim 1, where the attachment feature comprises at least two polymer strips or pads which are bonded to the back sheet of a panel.

3. A method according to claim 2, where the polymer strips or pads are bonded to the back sheet of the panel by adhesive joining methods.

4. A method according to claim 2, where the polymer strips or pads are bonded to the back sheet of the panel by welding.

5. A method according to claim 1, where the attachment features comprise at least two strips or pads which are molded or formed integrally in conjunction with fabrication of the back sheet.

6. A method according to claim 1 wherein the said at least one attachment feature of the panel is adapted to be detachably engaged with the said feature on site so as to allow the panel to be removably attached on site.

7. A method according to claim 1, wherein the step of applying the attachment feature to the outer side of the polymer back sheet is performed using a laser, wherein at least part of the attachment feature or back sheet is transparent to the said laser, wherein a laser-absorbing material is illuminated with the laser through the said transparent part so as to produce a laser weld between the attachment feature and the back sheet.

8. A method according to claim 7, wherein the laser weld is applied as a linear process travelling along an elongate length of the attachment feature.

9. A method according to claim 7, wherein the laser is simultaneously directed towards two spatially separated transparent parts of the attachment feature so as to form two laser welds simultaneously.

10. A method of installing a photo voltaic panel at an installation location, comprising:—
providing a photo voltaic panel fabricated by a method according to claim 1;
providing a support structure at the installation location, the support structure comprising at least one feature for engagement with the at least one attachment feature of the panel; and
engaging the said at least one feature of the support structure with the said at least one attachment feature of the panel such that the photo voltaic panel is mounted to the support structure.

11. A photo voltaic generator panel including a glass superstrate, photovoltaic cells and a polymer back sheet, in which there is on the outside of the back sheet at least one polymer attachment feature manufactured with the panel, such polymer attachment feature comprising two slots for engagement of the at least one polymer attachment feature with at least one corresponding feature incorporated in a support structure at site when the panel has been transported to that site, wherein the two slots comprise grooves for reducing the contact area between the at least one polymer attachment feature and the at least one corresponding feature of the support structure, and wherein the at least one polymer attachment feature and said outer side of the polymer back sheet have the same thermal expansion coefficient.

12. A panel according to claim 11, where the height of the attachment feature above the back sheet is between 1 mm and 13 mm.

13. A panel as claimed in claim 11, in which the attachment feature comprises a strip of polymer material bonded to the back sheet.

14. A panel as claimed in claim 11, wherein the attachment feature does not extend beyond the edge of the back sheet or does not extend more than 10 millimeters beyond the edge of the back sheet.

15. A panel as claimed in claim 11, where the at least one attachment features is formed as an elongate strip and the strip extends slightly beyond the length of the panel, thus providing a gap between adjacent panels when installed.

16. A panel as claimed in claim 11, wherein the at least one attachment feature is contained fully within a geometrical envelope defined by the edges of the back sheet.

17. A panel as claimed in claim 11, wherein the attachment feature has at least one part transparent to IR laser radiation.

18. A panel as claimed in claim 17, wherein the at least one transparent part is a flange for attachment to the back sheet.

19. A panel as claimed in claim 11, further comprising a laser absorbing layer on one or each of the back sheet and attachment feature in a location which is to form part of a joint between the back sheet and the attachment feature.

20. A panel as claimed in claim 11 wherein the attachment feature is laser welded to the back sheet.

21. A panel as claimed in claim 17, wherein the attachment feature is formed as an elongate strip and the at least one transparent part comprises two opposing elongate lengths of said elongate strip.

22. A photo voltaic generator panel installation system comprising:
a photo voltaic generator panel including a glass superstrate, photo voltaic cells and a polymer back sheet, in which there is on an outside of the polymer back sheet at least one polymer attachment feature manufactured with the photo voltaic generator panel, the at least one polymer attachment feature projecting with respect to the polymer back sheet; and
a support structure for the photo voltaic generator panel comprising at least one feature for engagement with the at least one polymer attachment feature, and wherein the at least one polymer attachment feature and said outside of the polymer back sheet have the same thermal expansion coefficient,
wherein the at least one polymer attachment feature comprises two slots for engagement of the at least one polymer attachment feature and the at least one feature of the support structure, the two slots comprising grooves for reducing the contact area between the at least one polymer attachment feature and the at least one feature of the support structure during said engagement.

23. A system as claimed in claim 22, in which the support structure is a ground mounted metal structure, a concrete structure, a roof or facade of a building, or a solar tracking structure.

24. A system as claimed in claim 22, in which the at least one feature of the support structure is an integral part of a roofing element.

25. A system as claimed in claim 22, wherein the support structure is a part of a fixed ground mounted support structure, a solar tracking device or support structures for flat or tilted roofs or facades.

26. A system as claimed in claim 22, wherein the support structure comprises support members configured to engage with the attachment features of the photo voltaic generator panel.

27. A system as claimed in claim 22, further comprising an additional anti-theft protection, or features preventing unintentional sliding of the photo voltaic generator panel relative to the support structure or deformation of the support structure.

28. A system as claimed in claim 22, in which there are spacer elements attached to the panel or support structure to promote uniform spacing of panels on the support structure.

29. A system as claimed in claim 22, wherein the height of the at least one polymer attachment feature above the back sheet is between 1 mm and 13 mm.

30. A system as claimed in claim 22, wherein said slots face in opposite directions and wherein the at least one feature of the support structure comprises opposing-facing edges for effecting said engagement.

31. A system as claimed in claim 22, wherein said slots face in a common direction, wherein each said slot comprises one or more locking projections, and wherein the at least one feature of the support structure comprises slots or grooves to engage with said locking projections.

* * * * *